US008005445B2

(12) United States Patent
Kuriyama et al.

(10) Patent No.: US 8,005,445 B2
(45) Date of Patent: Aug. 23, 2011

(54) RF POWER AMPLIFYING DEVICE AND WIRELESS COMMUNICATION TERMINAL DEVICE

(75) Inventors: Akira Kuriyama, Kokubunji (JP); Hidetoshi Matsumoto, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 650 days.

(21) Appl. No.: 11/940,464

(22) Filed: Nov. 15, 2007

(65) Prior Publication Data

US 2008/0125061 A1 May 29, 2008

(30) Foreign Application Priority Data

Nov. 27, 2006 (JP) ................................ 2006-318533

(51) Int. Cl.
*H04B 1/04* (2006.01)
*H04K 3/00* (2006.01)

(52) U.S. Cl. .............. 455/127.3; 455/127.4; 330/124 R; 330/295

(58) Field of Classification Search ............... 455/127.3, 455/127.4, 126; 330/124 R, 126, 295
See application file for complete search history.

(56) References Cited

U.S. PATENT DOCUMENTS 6,954,623 B2 10/2005 Chang et al.
7,170,353 B2 1/2007 Amano
2006/0140573 A1* 6/2006 Kim .............................. 385/147

FOREIGN PATENT DOCUMENTS

JP 06-125234 A 5/1994
JP 2005-143089 A 6/2005
JP 2006-521060 T 9/2006
WO WO 2005/086360 A1 9/2005

OTHER PUBLICATIONS

Ikeda et al., "A Low Distortion and High Efficiency Parallel-Operation Power Amplifier Combined in Different Phases in Wide Range of Load Impedances", 1996 IEEE MTT-S Digest, pp. 535-538.
Madic et al., "Accurate Power Control Technique for Handset PA Modules with Integrated Directional Couplers", 2003 IEEE Radio Frequency Integrated Circuits Symposium, pp. 715-718.
Scuderi et al., "A VSWR-Protected Silicon Bipolar RF Power Amplifier With Soft-Slope Power Control", IEEE Journal of Solid-State Circuits, vol. 40, No. 3, Mar. 2005., pp. 611-621.
Madic et al., "Accurate power Control Technique for Handset PA Modules with Integrated Directional Couplers" 2003 IEEE Radio Frequency Integrated Circuits Symposium, pp. 715-718.

* cited by examiner

*Primary Examiner* — Lee Nguyen
(74) *Attorney, Agent, or Firm* — Miles & Stockbridge P.C.

(57) ABSTRACT

A RF power amplifying device is constituted by a system of a balanced amplifier including first phase shifters, a first RF power amplifier, a second RF power amplifier, second phase shifters, and a power combiner. Transmitting power Pout is detected by a first power level detector connected to an output of the first RF power amplifier, a second power level detector connected to an output of the second RF power amplifier, and an adder. A level control signal from a level control circuit controls transmitting power in response to a transmitting signal with wanted power level and a detected signal of the adder.

15 Claims, 7 Drawing Sheets

RF POWER AMPLIFYING DEVICE AND WIRELESS COMMUNICATION TERMINAL DEVICE

CLAIM OF PRIORITY

The present application claims priority from Japanese application JP 2006-318533 filed on Nov. 27, 2006, the content of which is hereby incorporated by reference into this application.

FIELD OF THE INVENTION

The present invention relates to a RF (Radio Frequency) power amplifying device and a wireless communication terminal device and a mobile wireless communication terminal mounted with the RF power amplifying device, and, more particularly to a technique useful for improving performance without using an isolator and a directional coupler.

BACKGROUND OF THE INVENTION

There are plural communication systems in mobile communication represented by a cellular phone. For example, in Europe, in addition to GSM widely used as a second generation for wireless communication system and EDGE in which data communication rate of GSM is improved, there is W-CDMA as a third generation for wireless communication system brought into operation in recent years. In North America, in addition to DCS and PCS as the second generation for wireless communication system, cdma-1x as the third generation for wireless communication system is spread. GSM is an abbreviation of Global System for Mobile Communication. EDGE is an abbreviation of Enhanced Data rate for GSM Evolution. W-CDMA is an abbreviation of Wideband Code Division Multiple Access. DCS is an abbreviation of Digital Cellular System. PCS is an abbreviation of Personal Communication System. Cdma-1x is an abbreviation of Code Division Multiple Access 1x.

A mode of a radio frequency power amplifier included in a cellular phone terminal is a saturation mode in GSM in a basic mode in which only phase modulation is used and, is a linear mode at a bias point several dB backed off from a saturation mode point of GSM in EDGE, in which amplitude modulation is used together with phase modulation. The mode of the radio frequency power amplifier is also a linear mode in W-CDMA and cdma-1x in which amplitude modulation is used together with phase modulation.

In a radio frequency circuit block of a cellular phone terminal corresponding to GSM and EDGE, an antenna switch is arranged between a radio frequency power amplifier and an antenna. The antenna switch executes a function of switching a transmission slot and a reception slot of a TDMA (Time Division Multiple Access) system.

In a radio frequency circuit block of a cellular phone terminal corresponding to W-CDMA and cdma-1x, a duplexer is arranged between a radio frequency power amplifier and an antenna. The duplexer executes a function of processing transmission of a RF transmitting signal at a low RF frequency and reception of a RF reception signal at a high RF frequency in CDMA (code division multiple access) system in parallel. Moreover, in W-CDMA, cdma-1x, and the like, an isolator is arranged between the radio frequency power amplifier and the duplexer to prevent load mismatching in the antenna from affecting the radio frequency power amplifier. However, since it is difficult to integrate the isolator in a structure in which the radio frequency power amplifier is manufactured, the isolator is a large and expensive components.

In Hikaru Ikeda et al, "A Low Distortion and High Efficiency Parallel-Operation Power Amplifier Combined in Different Phases in Wide Range of Load Impedances", 1996 IEEE MTT-S Digest, pp. 535-538 (hereinafter, Non-Patent Document 1), a parallel power amplifier that realizes low distortion and high efficiency with load impedance in a wide range without using an isolator is described. This parallel power amplifier has plural amplifying paths. An input signal of one input terminal is supplied to inputs of the plural amplifying paths by a hybrid divider. The respective amplifying paths include amplifiers and phase shifters. Phase shifters are arranged on the plural amplifying paths such that phases of operation of the amplifiers are different in the plural amplifying paths. Plural outputs of the plural amplifying paths are combined into a single output by a hybrid combiner. In Non-Patent Document 1, it is described that distortion equal to or lower than −45 dBc, efficiency equal to or higher than 45%, and a gain equal to or higher than 9.8 dB are obtained at a VSWR equal to or lower than 3:1 equivalent to a reflection coefficient Γ of 0.5. VSWR is an abbreviation of Voltage Standing-Wave Ratio. The VSWR is obtained from $VSWR=(1+\Gamma)/(1-\Gamma)$ according to the reflection coefficient Γ.

In U.S. Pat. No. 6,954,623 (hereinafter, Patent Document 1), a balanced amplifier similar to the parallel power amplifier described in Non-Patent Document 1 is described. This balanced amplifier has plural amplifying paths. An input signal of one input terminal is supplied to inputs of the plural amplifying paths by a power divider. First phase shift components are arranged in the inputs of the respective amplifying paths and second phase shift components are arranged in outputs of the respective amplifying paths. An impedance transformer is connected to the second phase shift components. A power combiner combines plural outputs of the plural amplifying paths into one output. In Patent Document 1, it is described that, even if mismatching of impedance between an output of the power amplifier and the antenna occurs, an ACPR of the entire balanced amplifier is satisfactory. This is because impedance transformation of the power amplifier of one of the two amplifying paths changes to inductive rotation on a Smith chart and impedance transformation of the other power amplifier changes to capacitive rotation on the Smith chart. As a result, when one impedance is high impedance, the other impedance is low impedance. Thus, it is possible to correct distortion of a combined signal. ACPR is an abbreviation of Adjacent Channel Leakage Power Ratio. In Patent Document 1, it is described that a part of amplified transmitting signal energy of an output of the balanced amplifier is supplied to a power control block and, on the other hand, a D/A converter of a base band sub-system supplies a reference voltage as a power level signal to this power control block. This power control block is an output power control block of a closed loop that controls output power of the balanced amplifier. However, in Patent Document 1, there is no description about a specific structure of a circuit for supplying a part of the amplified transmitting signal energy of the output of the balanced amplifier to the power control block.

On the other hand, as another tendency concerning a radio frequency circuit structure in a cellular phone terminal, an output power detection circuit is built in a radio frequency power amplifier module including a radio frequency power amplifier. For example, in Jelena Madic et al, "Accurate Power Control Technique or Handset PA Modules with Integrated Directional Couplers", 2003 IEEE Radio Frequency Integrated Circuits Symposium, pp. 715-718 (hereinafter, Non-Patent Document 2), it is described that a directional coupler that detects power generated by the power amplifier is integrated in a power amplifier module together with the power amplifier. A main path of the directional coupler is connected between the output of the power amplifier and the antenna. A coupled path of the directional coupler is connected between a termination resistor and an input of a power level control block. The directional coupler can detect a detected voltage of a vector sum of a combined voltage from a forward signal generated by the power amplifier and a combined voltage from a reverse signal reflected by a load.

SUMMARY OF THE INVENTION

By using the directional coupler integrated in the power amplifier module described in Non-Patent Document 2, it is possible to detect a detected voltage of a vector sum of a combined voltage from a forward signal generated by the power amplifier and a combined voltage from a reverse signal reflected by a load. By applying the directional coupler described in Non-Patent Document 2 to the balanced amplifier described in Non-Patent Document 1 or Patent Document 1, it is possible to make the isolator unnecessary and provide a power amplifier module that has a satisfactory ACPR even if load mismatching occurs. In other words, by adopting the balanced amplifier described in Non-Patent Document 1 or Patent Document 1, it is possible to realize low distortion and high efficiency with load impedance in a wide range without using the isolator, which is a large and expensive component. On the other hand, in order to precisely control transmitting output power from this balanced amplifier, as described in Patent Document 1, it is necessary to detect a transmitting output power level, compare the transmitting output power level with a signal with wanted power level, and perform output power control of a closed loop by the power control block. For the detection of this transmitting output power level, it is possible to adopt the directional coupler described in Non-Patent Document 2.

However, a problem in that it is necessary to set a path length of the main path and the coupled path of the directional coupler to ¼ of a wavelength λ of a RF frequency in use, an area of the power amplifier module increases, and it is difficult to reduce a size of the power amplifier module has been clarified by the examination of the inventors. Moreover, a problem in that, if characteristics such as directivity of the directional coupler integrated in the power amplifier module are not satisfactory, the directional coupler cannot detect a reverse signal from the load with sufficient sensitivity has also been clarified by the examination of the inventors.

The present invention has been devised as a result of the examination of the inventors prior to the present invention described above. Therefore, it is an object of the present invention to realize low distortion and high efficiency with load impedance in a wide range without using an isolator and detect a detected voltage of a vector sum of a forward signal from a balanced amplifier and a reverse signal from a load without using a directional coupler.

The above-mentioned and other objects and new characteristics of the present invention will be made evident from the description of this specification and the attached drawings.

Among inventions disclosed in this application, outlines of representative inventions are briefly explained below.

A representative RF power amplifying device of the present invention is constituted by a system of a balanced amplifier including first phase shifters, a first RF power amplifier, a second RF power amplifier, second phase shifters, and a power combiner. Power is detected by a first power level detector connected to an output of the first RF power amplifier, a second power level detector connected to an output of the second RF power amplifier, and an adder.

As a result, it is possible to detect a detected voltage of a vector sum of a forward signal from the balanced amplifier and a reverse signal from a load without using a directional coupler.

The effects obtained by representative inventions among the inventions disclosed in this application are briefly explained below.

According to the present invention, it is possible to realize low distortion and high efficiency with load impedance in a wide range without using an isolator and detect a detected voltage of a vector sum of a forward signal from a balanced amplifier and a reverse signal from a load without using a directional coupler.

DETAILED DESCRIPTION OF THE PREFERRED EMBODIMENTS

1. Summary of the Preferred Embodiments

Figure 1:
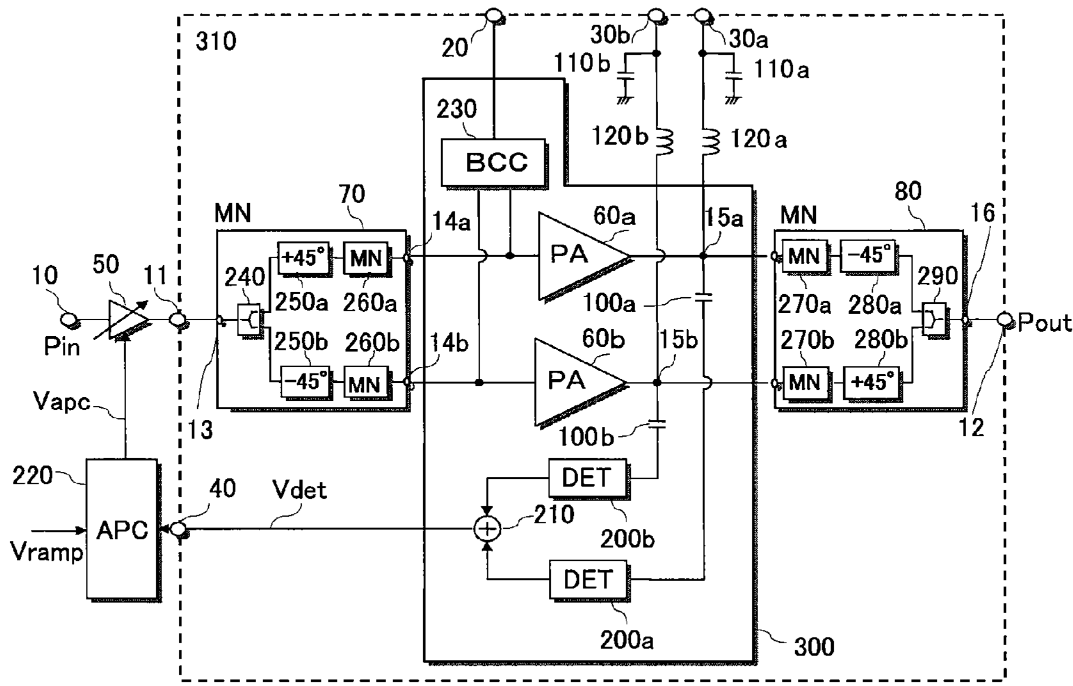
FIG. 1 is a block diagram showing a part of a transmitter circuit of a cellular phone terminal including a RF power amplifier module according to an embodiment of the present invention.

First, outlines about preferred embodiments of the present invention disclosed in this application are explained. Reference numerals and signs in parentheses in the drawings referred to in the explanation of the outlines about the preferred embodiments merely illustrate components included in concepts of components denoted by the reference numerals and signs.

[1] A RF (Radio Frequency) power amplifying device (310) according to a preferred embodiment of the present invention includes a first RF power amplifier (60*a*) and a second RF power amplifier (60*b*).

The RF power amplifying device includes first phase shifters (250*a* and 250*b*) arranged on input sides of the first RF power amplifier and the second RF power amplifier and second phase shifters (280*a* and 280*b*) arranged on output sides of the first RF power amplifier and the second RF power amplifier.

The RF power amplifying device is constituted by a system of a balanced amplifier including a power combiner (290) that combines an output of the first RF power amplifier and an output of the second RF power amplifier transmitted through the second phase shifter.

The RF power amplifying device further includes a first power level detector (200*a*), to an input of which the output of the first RF power amplifier is supplied, a second power level detector (200*b*), to an input of which the output of the second RF power amplifier is supplied, and an adder (210) to which an output of the first power level detector and an output of the second power level detector are supplied (see FIG. 1).

Therefore, according to the embodiment, the RF power amplifying device is constituted by the system of the balanced amplifier including the first phase shifters, the first RF power amplifier, the second RF power amplifier, the second phase shifters, and the power combiner. Therefore, it is possible to realize low distortion and high efficiency with load impedance in a wide range without using an isolator. According to the embodiment, the RF power amplifying device includes the first power level detector, the second power level detector, and the adder in order to detect transmitting power levels. Therefore, it is possible to detect a detected voltage of a vector sum of a forward signal from the balanced amplifier and a reverse signal from a load without using a directional coupler.

As a preferred embodiment, the RF power amplifying device further includes a power level control circuit (220) that generates a power level control signal (Vapc) for controlling a level of RF transmitting power obtained at an output (16) of the power combiner in response to a transmitting signal with wanted power level (Vramp) and a detected signal (Vdet) from an output of the adder. When a level of the detected signal rises to be higher than the transmitting signal with wanted power level, the level of the RF transmitting power is lowered according to the power level control signal generated from the power level control circuit.

Figure 3A:
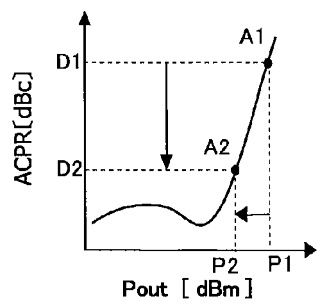
FIGS. 3A and 3B are graphs showing a relation between an adjacent channel leakage power ratio and current consumption with respect to RF output power of a general RF power amplifier.
Figure 3B:
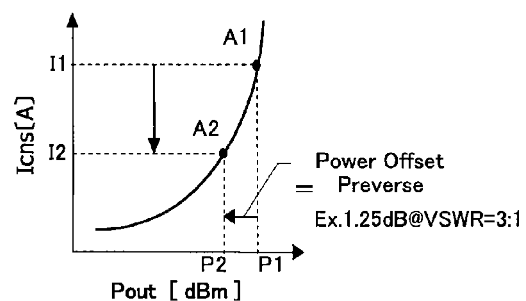

Therefore, according to the preferred embodiment, even when the load comes into a state of mismatching and a reverse signal from the load extremely increases, it is possible to reduce an increase in RF power and an increase in distortion and current consumption due to an ACPR (see FIGS. 3A and 3B).

As a more preferred embodiment, the first power level detector detects an output signal proportional to a square of an output voltage (Va) of the first power level detector and the second power level detector generates an output signal proportional to a square of an output voltage (Vb) of the second power level detector.

As another more preferred embodiment, the RF power amplifying device further includes a variable gain amplifier (50) controlled according to the power level control signal (Vapc) generated from the power level control circuit (220). The RF power amplifying device further includes a power divider (240) that supplies an output of the variable gain amplifier to plural inputs of the first phase shifters. The variable gain amplifier amplifies a RF signal input (Pin) supplied to a RF signal input terminal (10) in response to a level of the power level control signal (Vapc). A gain-controlled RF amplified output signal from an output of the variable gain amplifier (50) is supplied to an input of the first RF power amplifier and an input of the second RF power amplifier via the power divider and the first phase shifters.

As a still more preferred embodiment, the first RF power amplifier, the second RF power amplifier, the first phase shifters, the second phase shifters, the power combiner, the first power level detector, the second power level detector, and the adder of the RF power amplifying device are formed in a package of the RF power amplifier module (310).

As a still more preferred embodiment, the first RF power amplifier is constituted by first multi-stage amplifiers (60*c* and 60*a*) and the second RF power amplifier is constituted by second multi-stage amplifiers (60*d* and 60*b*). A first electrical length from an output of a drive-stage amplifier (60*c*) of the first multi-stage amplifiers of the first RF power amplifier to an output of a power-stage amplifier (60*a*) of the first multi-stage amplifiers of the first RF power amplifier is set to a predetermined length. A second electrical length from an output of a drive-stage amplifier (60*d*) of the second multi-stage amplifier of the second RF power amplifier to an output of a power-stage amplifier (60*b*) of the second multi-stage amplifier of the second RF power amplifier is set substantially equal to the first electrical length set to the predetermined length (see FIG. 8).

As a specific embodiment, the first phase shifters supply two RF input signals having a phase difference of about 90 degrees to the input of the first RF power amplifier and the input of the second RF power amplifier. The second phase shifters adjust phases between the outputs of the first and second RF power amplifiers and an input of the power combiner. Consequently, a phase of the output of the first RF power amplifier and a phase of the output of the second RF power amplifier transmitted to the power combiner through the second phase shifters substantially coincide with each other.

Figure 9:
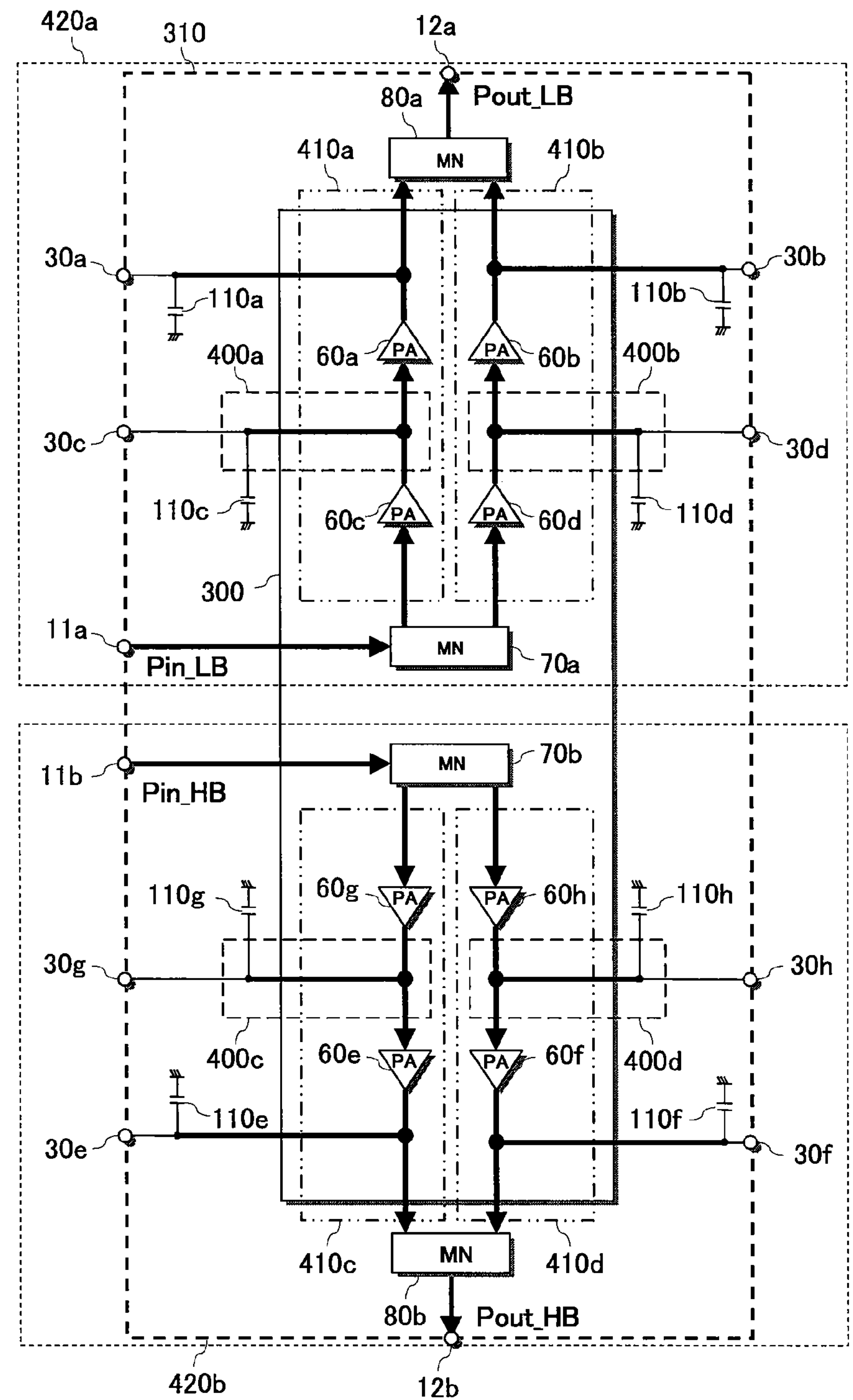
FIG. 9 is a block diagram showing a part of a transmitter circuit of a cellular phone terminal including a RF power amplifier module that generates a RF transmitting power signal of a multi-band according to still another embodiment of the present invention.

As another specific embodiment, in the RF power amplifier module (310), a balanced amplifier (420*a*) including the first phase shifters, the first RF power amplifier, the second RF power amplifier, and the second phase shifters amplifies a frequency band of any one of GSM850, GSM900, W-CDMA band 5, and W-CDMA band 6. The RF power amplifier module (310) further includes another balanced amplifier (420*b*)

that includes an input matching network (70*b*), third RF power amplifiers (60*g* and 60*e*) and fourth RF power amplifiers (60*h* and 60*f*) connected to two outputs of the input matching network, and an output matching network (80*b*), two inputs of which are connected to outputs of the third RF power amplifiers (60*g* and 60*e*) and outputs of the fourth RF power amplifiers (60*h* and 60*f*) and amplifies a frequency band of any one of DCS1800, PCS1900, W-CDMA band 1, W-CDMA band 2, W-CDMA band 3, and W-CDMA band 4 (see FIG. 9).

[2] A wireless communication terminal device according to another embodiment of the present invention includes the first RF power amplifier (60*a*) and the second RF power amplifier (60*b*).

The wireless communication terminal device includes the first phase shifters (250*a* and 250*b*) arranged on the input sides of the first RF power amplifier and the second RF power amplifier and the second phase shifters (280*a* and 280*b*) arranged on the output sides of the first RF power amplifier and the second RF power amplifier.

The wireless communication terminal device is constituted by the system of the balanced amplifier including the power combiner (290) that combines an output of the first RF power amplifier and an output of the second RF power amplifier transmitted through the second phase shifters (280*a* and 280*b*).

The wireless communication terminal device further includes the first power level detector (200*a*), to the input of which the output of the first RF power amplifier is supplied, the second power level detector (200*b*), to the input of which the output of the second RF power amplifier is supplied, and the adder (210) to which an output of the first power level detector and an output of the second power level detector are supplied (see FIG. 1).

The wireless communication terminal device further includes the power level control circuit (220) that generates a power level control signal (Vapc) for controlling a level of RF transmitting power obtained at the output (16) of the power combiner in response to a transmitting signal with wanted power level (Vramp) and a detected signal (Vdet) from the output of the adder. When a level of the detected signal rises to be higher than the transmitting signal with wanted power level, the level of the RF transmitting power is lowered according to the power level control signal generated from the power level control circuit.

Figure 11:
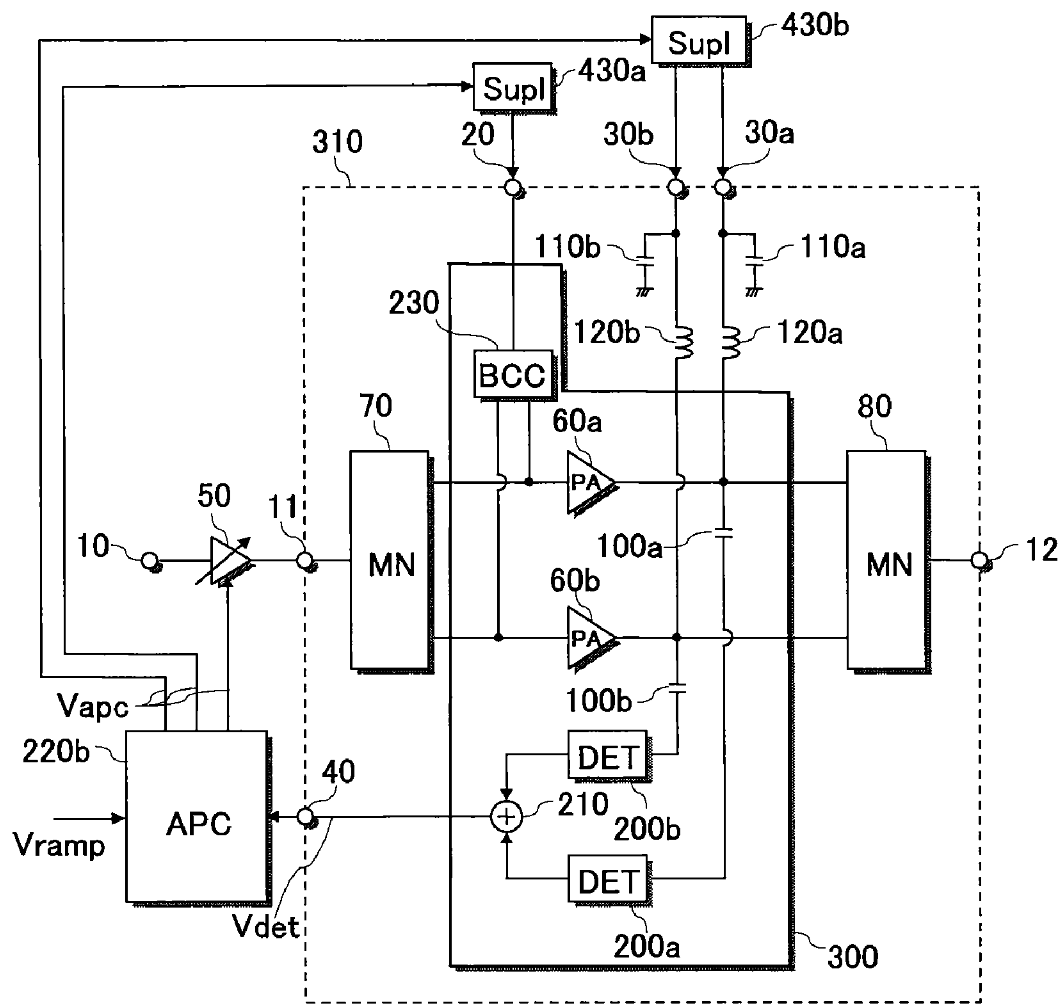
FIG. 11 is a block diagram showing a part of a transmitter circuit of a cellular phone terminal including a RF power amplifier module according to still another embodiment of the present invention.

The wireless communication terminal device further includes a voltage source circuit (430) that supplies a drive voltage supplied to at least the first RF power amplifier and the second RF power amplifier on the basis of an operating voltage from a battery mounted thereon (see FIG. 11).

Therefore, according to another embodiment, even when the load comes into a state of mismatching and a reverse signal from the load extremely increases, it is possible to reduce consumption of the mounted battery.

2. Further Detailed Description of the Preferred Embodiments

Embodiments are further explained in detail. Best mode for carrying out the present invention is explained in detail below on the basis of the drawings. In all the drawings for explaining the best mode for carrying out the present invention, members having identical functions are denoted by identical reference numerals and signs and repeated explanation of the members is omitted.

<<Structure of a Transmitter Circuit of a Cellular Phone Terminal>>

FIG. 1 is a block diagram showing a part of a transmitter circuit of a cellular phone terminal including a RF power amplifier module according to an embodiment of the present invention. As shown in FIG. 1, the transmitter circuit of the cellular phone terminal includes the RF power amplifier module 310, the variable gain amplifier 50, and the APC circuit 220. APC means Automatic Power Control.

The RF power amplifier module 310 includes, in a package indicated by a broken line of the RF power amplifier module 310, an input matching network 70, a silicon semiconductor chip 300, by-pass condensers 110*a* and 110*b*, choke inductors 120*a* and 120*b*, and an output matching network 80.

The silicon semiconductor chip 300 includes RF power amplifiers 60*a* and 60*b*, coupling condensers 100*a* and 100*b*, power level detectors 200*a* and 200*b*, an adder 210, and a bias control circuit 230 of a balanced amplifier.

A RF signal input terminal 10 is connected to an input terminal of the variable gain amplifier 50. An output of the variable gain amplifier 50 is connected to the input matching network 70 via a RF signal input terminal 11. The input matching network 70 is a circuit having three terminals for one input and two outputs. An input terminal 13 is connected to the RF signal input terminal 11, one output terminal 14*a* is connected to an input of the RF power amplifier 60*a*, and the other output terminal 14*b* is connected to an input of the RF power amplifier 60*b*. The RF signal input terminal 13 of the input matching network 70 is connected to an input of a power divider 240. One output of the power divider 240 is connected to an input of a +45 degree phase shifter 250*a* and the other output of the power divider 240 is connected to an input of a −45 degree phase shifter 250*b*. An output of the +45 degree phase shifter 250*a* and an output of the −45 degree phase shifter 250*b* are connected to an input of a matching network 260*a* and an input of a matching network 260*b*, respectively. An output of the matching network 260*a* and an output of the matching network 260*b* are outputs 14*a* and 14*b* of the input matching network 70. The outputs 14*a* and 14*b* of the input matching network 70 are connected to the inputs of the RF power amplifiers 60*a* and 60*b*, respectively.

The bias control circuit 230 is a three-port circuit including at least one input and two outputs. Two output terminals are connected to the inputs of the RF power amplifiers 60*a* and 60*b*, respectively, and an input terminal is connected to the bias control input terminal 20 of the module 310. Drive voltage supplying terminals 30*a* and 30*b* of the module 310 are connected to the outputs of the RF power amplifiers 60*a* and 60*b*, respectively, via the choke inductors 120*a* and 120*b*. The choke inductors 120*a* and 120*b* are load components at final amplifying stages of the RF power amplifiers 60*a* and 60*b*. Moreover, the by-pass condenser 110*a* is connected to a node between the drive voltage supplying terminal 30*a* and the choke inductor 120*a*. The by-pass condenser 110*b* is connected to a node between the drive voltage supplying terminal 30*b* and the choke inductor 120*b*.

One terminals of the coupling condensers 100*a* and 100*b* are connected to the outputs of the RF power amplifiers 60*a* and 60*b*, respectively. The other terminals of the coupling condensers 100*a* and 100*b* are connected to inputs of the power level detectors 200*a* and 200*b*, respectively. Outputs of the power level detectors 200*a* and 200*b* are connected to the adder 210. A detected voltage Vdet of a detected output terminal 40, which is an output of the adder 210, is connected to an input of the APC circuit 220. A transmitting power level signal Vramp is supplied to the APC circuit 220 via a base band signal processing LSI and a RF analog signal processing integrated circuit. Moreover, an APC control voltage Vapc of an output of the APC circuit 220 is supplied to the variable gain amplifier 50. The transmitting power level signal Vramp is a signal indicating a level of a RF transmitting signal transmitted from a power amplifier of a mobile wireless communication terminal according to a distance between a base station and the mobile wireless communication terminal. A closed loop of the variable gain amplifier 50, the RF power amplifier module 310, and the APC circuit 220 of the transmitter circuit of the cellular phone terminal controls a level of the APC control voltage Vapc such that the detected voltage Vdet coincides with the transmitting power level signal Vramp. Consequently, a level of a RF transmitting signal transmitted from the power amplifier can be controlled according to the transmitting power level signal Vramp. In another embodiment, the variable gain amplifier 50 is omitted and, on the other hand, the APC control voltage Vapc from the APC circuit 220 can be supplied to the bias control input terminal 20 of the bias control circuit 230. Bias levels of the RF power amplifiers 60*a* and 60*b* are controlled according to a level of the APC control voltage Vapc. As a result, gain of the RF power amplifiers 60*a* and 60*b* can be controlled and RF transmitting output power levels of the RF power amplifiers 60*a* and 60*b* can be controlled. In still another embodiment, the APC control voltage Vapc from the APC circuit 220 can be supplied to the bias control circuit 230 and supplied to a drive voltage supplying circuit that supplies drive voltages to the drive voltage supplying terminals 30*a* and 30*b*. Drive voltage levels of the RF power amplifiers 60*a* and 60*b* are controlled according to a level of the APC control voltage Vapc. As a result, gains of the RF power amplifiers 60*a* and 60*b* can be controlled and RF transmitting output power levels of the RF power amplifiers 60*a* and 60*b* can be controlled.

The output matching network 80 is a three-port circuit including two inputs and one output. One input terminal 15*a* is connected to the output of the RF power amplifier 60*a*, the other input terminal 15*b* is connected to the output of the RF power amplifier 60*b*, and an output terminal 16 is connected to the RF signal output terminal 12. The RF signal input terminals 15*a* and 15*b* of the output matching network 80 are connected to the outputs of the RF power amplifiers 60*a* and 60*b*, respectively. The RF signal input terminals 15*a* and 15*b* are also connected to inputs of matching networks 270*a* and 270*b*. An output of one matching network 270*a* is connected to an input of the −45 degree phase shifter 280*a* and an output of the other matching network 270*b* is connected to an input of the +45 degree phase shifter 280*b*. An output of the −45 degree phase shifter 280*a* and an output of the +45 degree phase shifter 280*b* are connected to an input of the power combiner 290. An output of the power combiner 290 is an output 16 of the output matching network 80.

As described above, the silicon semiconductor chip 300 includes the integrated RF power amplifiers 60*a* and 60*b*, coupling condensers 100*a* and 100*b*, power level detectors 200*a* and 200*b*, adder 210, and bias control circuit 230. The silicon semiconductor chip 300 can also include a part or all of the input matching network 70 and the output matching network 80. The module 310 can also include a part or all of the variable gain amplifier 50 and the APC circuit 220.

Figure 12:
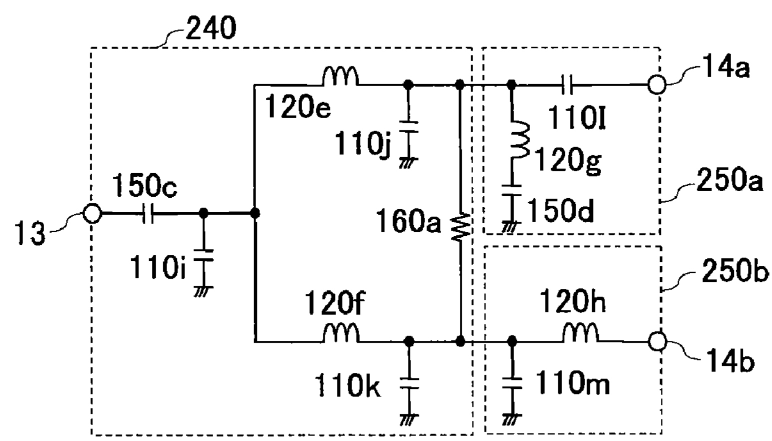
FIG. 12 is a circuit diagram showing an example of the structure of a power divider and a +45 degree phase/−45 degree phase shifter of an input matching network shown in FIG. 1.

FIG. 12 is a circuit diagram showing an example of the structure of the power divider 240, the +45 degree phase shifter 250*a*, and −45 degree phase shifter 250*b* of the input matching network 70 shown in FIG. 1. In FIG. 12, the power divider 240 is formed by condensers 150*c*, 110*i*, 110*j*, and 110*k*, inductors 120*e* and 120*f*, and a resistor 160*a*. The +45 degree phase shifter 250*a* is formed by an inductor 120*g*, a condenser 110*l*, and a DC cut capacitor 150*d*. The −45 degree phase shifter 250*b* is formed by a condenser 110*m* and an inductor 120*h*. The power divider 240 formed by the condensers 150*c*, 110*i*, 110*j*, and 110*k*, the inductors 120*e* and 120*f*, and the resistor 160*a* can also have a function of the matching networks 260*a* and 260*b*. In this case, since it is unnecessary to arrange the matching networks 260*a* and 260*b* in FIG. 1, it is possible to reduce a size of the circuit. In the input matching network 70 shown in FIG. 12, since a circuit form called a Wilkinson divider is applied to the power divider 240, it is easy to isolate the RF signal output terminals 14*a* and 14*b* from each other. Therefore, in the input matching network 70 shown in FIG. 12, stabilization and an increase in performance of the RF power amplifier module are possible.

Figure 13:
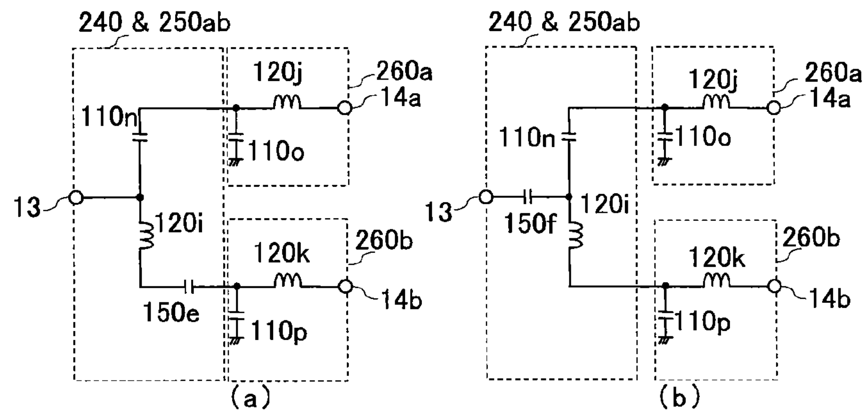
FIGS. 13A and 13B are circuit diagrams showing examples of other structures of the power divider and the phase shifters and the matching network of the input matching network shown in FIG. 1.

FIGS. 13A and 13B are circuit diagrams showing examples of other structures of the power divider and the phase shifters and the matching network of the input matching network 70 shown in FIG. 1. In FIG. 13A, a power divider 240 & 250*ab* that generates a 90 degree phase difference between two outputs is formed by a condenser 110*n*, an inductor 120*i*, and a DC cut capacitor 150*e*. A matching network 260*a* is formed by a condenser 110*o* and an inductor 120*j*. A matching network 260*b* is formed by a condenser 110*p* and an inductor 120*k*. The arrangement of the DC cut capacitor 150*e* and the inductor 120*i* may be reversed in the power divider 240 & 250*ab*. In the power divider 240 & 250*ab* in FIG. 13A, a DC cut capacitor 150*f* can also be used as shown in FIG. 13B.

In the circuit configuration in FIG. 13A, since the inductor 120*i* and the DC cut capacitor 150*e* are components that rotate a phase in directions opposite to each other, it is difficult to design the power divider and phase shifter 240 & 250*ab* and, on the other hand, fine adjustment of a circuit constant is possible. On the other hand, in the circuit configuration in FIG. 13B, since roles of the DC cut capacitor 150*f*, the condenser 110*n*, and the inductor 120*i* are clearly separated, it is possible to facilitate design. When a 90 degree phase shift is not obtained in the circuit configuration in FIG. 13A, the circuit configuration in FIG. 13B can be used.

Figure 14:
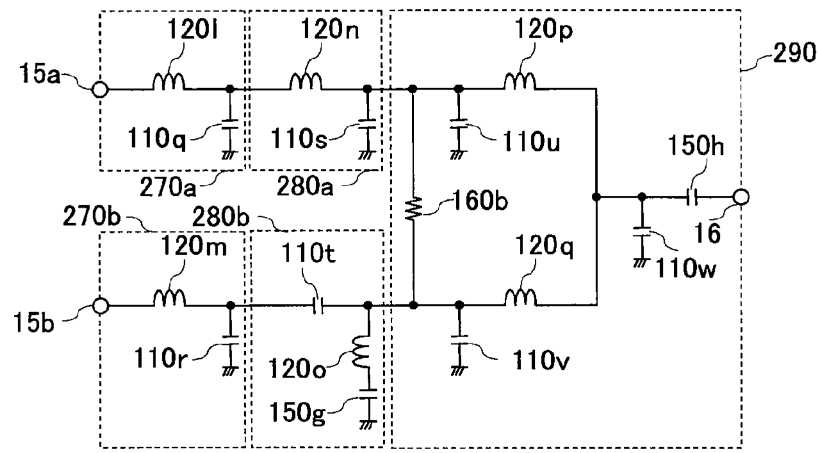
FIG. 14 is a circuit diagram showing an example of the structure of the matching network, the phase shifter, and a power combiner of the output matching network shown in FIG. 1.

FIG. 14 is a circuit diagram showing an example of the structure of the matching networks 270*a* and 270*b*, the phase shifters 280*a* and 280*b*, and the power combiner 290 of the output matching network 80 shown in FIG. 1. In FIG. 14, the matching network 270*a* is formed by an inductor 120*l* and a condenser 110*q* and the matching network 270*b* is formed by an inductor 120*m* and a condenser 110*r*. The −45 degree phase shifter 280*a* is formed by an inductor 120*n* and a condenser 110*s* and the +45 degree phase shifter 280*b* is formed by a condenser 110*t*, an inductor 120*o*, and a DC cut capacitor 150*g*. The power combiner 290 is formed by condensers 110*u*, 110*v*, and 110*w*, inductors 120*p* and 120*q*, a DC cut capacitor 150*h*, and a resistor 160*b*. The power combiner 290 formed by the condensers 110*u*, 110*v*, and 110*w*, the inductors 120*p* and 120*q*, and the DC cut capacitor 150*h*, and the resistor 160*b* can also have a function of a matching network. When the matching network 270*a* formed by the inductor 120*l* and the condenser 110*q* and the matching network 270*b* formed by the inductor 120*m* and the condenser 110*r* are unnecessary, the matching networks can be omitted for a reduction in size of the circuit. Moreover, it is desirable for a reduction in power consumption to use components having a small parasitic resistance component (a high Q factor) as at least the inductors 120*l*, 120*m*, and 120*n* and the condensers 110*q*, 110*r*, and 110*t*. For example, it is possible to use, as an inductor, a bonding wire or an air-coil containing Au as a main component. It is possible to use a chip condenser or an MIM (metal/insulator/metal) condenser formed on a semiconductor chip as a condenser having a high Q factor. In another embodiment, wiring in a multi-layer circuit board, a lead of a lead frame, or a spiral coil formed on a semiconductor chip can also be used as the inductor.

Figure 15:
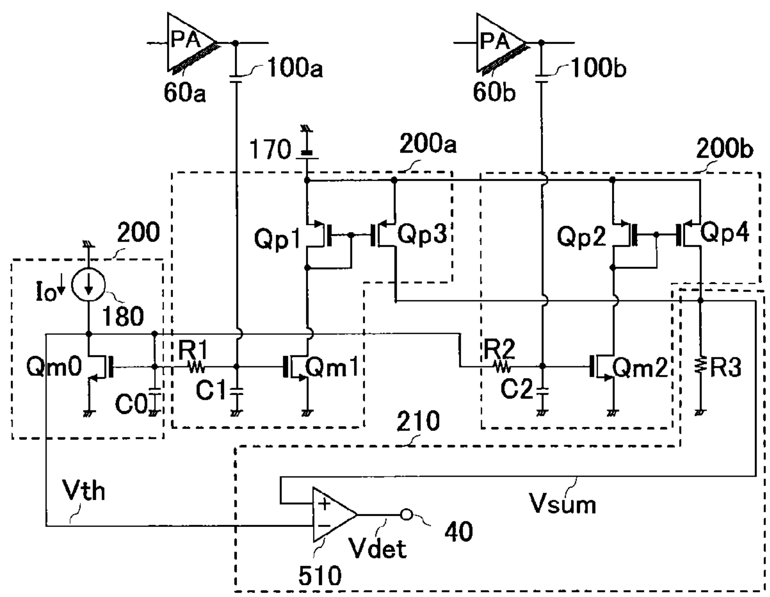
FIG. 15 is a circuit diagram showing an example of the structure of a power level detector and an adder shown in FIG. 1.

FIG. 15 is a circuit diagram showing an example of the structure of the power level detectors 200*a* and 200*b* and the adder 210 shown in FIG. 1. In FIG. 15, the power level detectors 200*a* and 200*b* are connected to a bias circuit 200 including a constant current source 180, a diode junction N-channel MOS Qm0, and a condenser C0. A gate of a detection N-channel MOS Qm1 of the power level detector 200*a* is biased to near a threshold voltage Vth of the diode junction N-channel MOS Qm0 of the bias circuit 200 via a ripple eliminate filter (a resistor R1 and a condenser C1). The gate of the detection N-channel MOS Qm1 of the power level detector 200*a* is connected to the output of the RF power amplifier 60*a* via the condenser 100*a*. A gate of a detection N-channel MOS Qm2 of the power level detector 200*b* is biased to near the threshold voltage Vth of the diode junction N-channel MOS Qm0 of the bias circuit 200 via a ripple eliminate filter (a resistor R2 and a condenser C2). The gate of the detection N-channel MOS Qm2 of the power level detector 200*b* is connected to the output of the RF power amplifier 60*b* via the condenser 100*b*.

A voltage at the output of the RF power amplifier 60*a* is represented as Va, a voltage at the output of the RF power amplifier 60*b* is Vb, a threshold voltage of the transistor MOS Qm1 is represented as Vth1, a threshold voltage of the transistor MOS Qm2 is represented as Vth2, Va is set larger than Vth1, and Vb is set larger than Vth2. As it is well known, when channel conductances of the transistor MOSs Qm1 and Qm2 are represented as $\beta_Q$m1 and $\beta_Q$m2, drain currents $I_Q$m1 and $I_Q$m2 of the transistor MOSs Qm1 and Qm2 are calculated as indicated by the following equations:

$$I_{Qm1} = \frac{1}{2}\beta_{Qm1}(Va - Vth1)^2 \cong \frac{1}{2}\beta_{Qm1} Va^2 \quad \text{Equation 1}$$

$$I_{Qm2} = \frac{1}{2}\beta_{Qm2}(Vb - Vth2)^2 \cong \frac{1}{2}\beta_{Qm2} Vb^2 \quad \text{Equation 2}$$

The drain current $I_Q$m1 of the detection transistor MOS Qm1 of the power level detector 200*a* is supplied to the resistor R3 of the adder 210 via a current mirror constituted by P channel MOSs Qp1 and Qp3. Similarly, the drain current $I_Q$m2 of the detection transistor MOS Qm2 of the power level detector 200*b* is supplied to the resistor R3 of the adder 210 via a current mirror constituted by P channel MOSs Qp2 and Qp4.

Therefore, an added voltage Vsum generated in the resistor R3 of the adder 210 is calculated by the following equation.

$$Vsum = R_3 \times (I_{Qm1} + I_{Qm2}) \cong \frac{1}{2} R_3 \times \beta_{Qm} \times (Va^2 + Vb^2) \quad \text{Equation 3}$$

Therefore, the added voltage Vsum obtained by the adder 210 is proportional to a sum of a square of the output voltage Va of the RF power amplifier 60*a* and a square of the output voltage Vb of the RF power amplifier 60*b*. In the adder 210, the threshold voltage Vth of the N-channel MOSs Qm0, Qm1, and Qm2 is subtracted from the added voltage Vsum, which is obtained by the adder 210, by a differential amplifier 510 and a detected voltage Vdet is generated by this subtraction.

<<Operations of a RF Power Amplifier Module>>

Next, operations of a RF power amplifier module according to an embodiment of the present invention are explained with reference to FIG. 1.

A RF input signal Pin supplied from the RF signal input terminal 10 is amplified by the variable gain amplifier 50 and supplied to the input matching network 70 via the RF signal input terminal 11 of the module 310. In the input matching network 70, a RF amplified signal is substantially divided into two by the power divider 240 and supplied to the phase shifters 250*a* and 250*b*. The RF amplified signal is subjected to +45 degree phase shift in the phase shifter 250*a* and subjected to −45 degree phase shift in the phase shifter 250*b*. As a result, phase difference signals having a 90 degree phase difference are outputted from the RF signal output terminals 14*a* and 14*b* by the phase shifters 250*a* and 250*b* and supplied to the RF power amplifiers 60*a* and 60*b*. The matching network 260*a* matches the output impedance of the phase shifter 250*a* and the input impedance of the RF power amplifier 60*a*. Similarly, the matching network 260*b* matches the output impedance of the phase shifter 250*b* and the input impedance of the RF power amplifier 60*b*.

The RF phase difference signal having the 90 degree phase difference is amplified to desired power by the RF power amplifiers 60*a* and 60*b* and outputted from the RF signal output terminal 12 via the output matching network 80. In the output matching network 80, the RF amplified signal supplied from the RF signal input terminal 15*a* is subjected to −45 degree phase shift by the phase shifter 280*a*. The RF amplified signal supplied from the RF signal input terminal 15*b* is subjected to +45 degree phase shift by the phase shifter 280*b*. Therefore, two RF signals of the outputs of the phase shifters 280*a* and 280*b* have substantially the same phases and, after being combined by the power combiner 290, RF transmitting output power Pout is outputted from the RF signal output terminal 16. The matching network 270*a* matches the output impedance of the RF power amplifier 60*a* and the input impedance of the phase shifter 280*a*. Similarly, the matching network 270*b* matches the output impedance of the RF power amplifier 60*b* and the input impedance of the phase shifter 280*b*. Moreover, the power combiner 290 can also have a function of matching, in performing power combination, the output impedance of the phase shifters 280*a* and 280*b* and the output impedance (usually, 50Ω) of the output terminal 12 of the module 310.

The bias control circuit 230 supplies an optimum bias voltage or bias current to the inputs of the RF power amplifiers 60*a* and 60*b* on the basis of a bias control signal applied to the bias control input terminal 20. Drive voltages applied from the drive voltage terminals 30*a* and 30*b* are supplied to the outputs of the RF power amplifiers 60*a* and 60*b* via the choke inductors 120*a* and 120*b*, respectively. The inputs of the RF power amplifiers 60*a* and 60*b* are base terminals when the RF power amplifiers 60*a* and 60*b* are bipolar transistors. The inputs of the RF power amplifiers 60*a* and 60*b* are gate terminals when the RF power amplifiers 60*a* and 60*b* are FETs (field effect transistors). The outputs of the RF power amplifiers 60*a* and 60*b* are collector terminals when the RF power amplifiers 60*a* and 60*b* are bipolar transistors. The outputs of the RF power amplifiers 60*a* and 60*b* are drain terminals when the RF power amplifiers 60*a* and 60*b* are FETs (field effect transistors). However, depending on a system for grounding transistors, the inputs and the outputs of the RF power amplifiers 60*a* and 60*b* can be electrodes other than the electrodes described above.

The output voltages Va and Vb of the RF power amplifiers 60*a* and 60*b* are supplied to the power level detectors 200*a* and 200*b* via the coupling condensers 100*a* and 100*b*, respectively. As described above, the detected voltage Vdet proportional to the sum of the square of the output voltage Va of the RF power amplifier 60*a* and the square of the output voltage Vb of the RF power amplifier 60*b* is outputted from the detected output terminal 40 by the power level detectors 200*a* and 200*b* and the adder 210. It would be understood from the following explanation that a value of this detected voltage Vdet is proportional to a sum of power of a forward signal and power of a reverse signal of RF signals at output terminals of the RF power amplifiers 60*a* and 60*b*.

Figure 2:
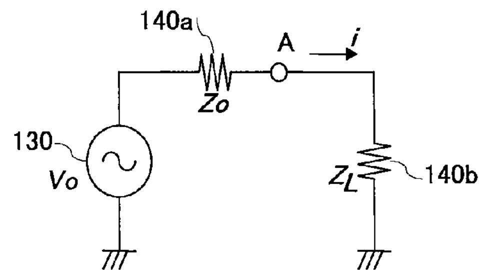
FIG. 2 is a simple equivalent circuit for calculating power extracted in a load during load mismatching.

FIG. 2 is a simple equivalent circuit for calculating power extracted in the load during load mismatching. When a voltage value of a signal source 130 is represented as $V_0$, output impedance 140*a* of the signal source 130 is represented as $Z_0$, and a value of load impedance 140*b* is represented as $Z_L$, a current and a voltage extracted in the load are represented by Equations 4 and 5, respectively.

$$i = \frac{v_o}{z_o + Z_L} \quad \text{Equation 4}$$

$$v = \frac{Z_L v_o}{z_o + Z_L} \quad \text{Equation 5}$$

When load impedance is represented as $Z_L$, a reflection coefficient at a point A is represented as Γ, and the load impedance $Z_L$ is calculated as follows, $$Z_L = \frac{1+|\Gamma|}{1-|\Gamma|} z_o \quad \text{Equation 6}$$

according to Equations 4 to 6, a current, a voltage, and power extracted in the load are represented by Equations 7 to 9.

$$i = \frac{v_o(1-|\Gamma|)}{2z_o} \quad \text{Equation 7}$$

$$v = \frac{v_o(1+|\Gamma|)}{2} \quad \text{Equation 8}$$

$$P = \frac{1}{4z_o}|v_o|^2(1-|\Gamma|^2) \quad \text{Equation 9}$$

Forward signal power Pforward at a point A is calculated by substituting the reflection coefficient Γ=0 in Equation 9 and represented by Equation 10.

$$P_{forward} = \frac{1}{4z_o}|v_o|^2 \quad \text{Equation 10}$$

Similarly, reverse signal power Preverse is represented as follows from Equations 9 and 10:

$$P_{reverse} = \frac{1}{4z_o}|v_o|^2|\Gamma|^2 \quad \text{Equation 11}$$

Phases of the RF signals of the output voltages Va and Vb of the RF power amplifiers 60*a* and 60*b* in FIG. 1 are different from each other by 90 degrees and load impedances of the RF power amplifiers 60*a* and 60*b* are different from each other by 90 degrees. Thus, the output voltages Va and Vb are simply represented as follows:

$$v_a = \frac{v_o(1+|\Gamma|)}{2} \quad \text{Equation 12}$$

$$v_b = \frac{-jv_o(1-|\Gamma|)}{2} \quad \text{Equation 13}$$

The detected voltage Vdet proportional to the sum of the square of the output voltage Va of the RF power amplifier 60*a* and the square of the output voltage Vb of the RF power amplifier 60*b* is represented as follows from Equations 12 and 13:

$$v_{det} = |v_a|^2 + |v_b|^2 = \frac{1}{2z_o}|v_o|^2(1+|\Gamma|^2) \quad \text{Equation 14}$$

and is further represented as follows from Equations 10 and 11.

$$v_{det} = |v_a|^2 + |v_b|^2 = 2(P_{forward} + P_{reverse}) \quad \text{Equation 15}$$

From the above explanation, it is understood that a value of the detected voltage Vdet proportional to the sum of the square of the output voltage Va of the RF power amplifier 60*a* and the square of the output voltage Vb of the RF power amplifier 60*b* is proportional to a sum of power of a forward signal and power of a reverse signal of RF signals at the outputs of the RF power amplifiers 60*a* and 60*b*. In a state in which the load is matched, the reverse signal power Preverse is 0.

FIGS. 3A and 3B are graphs showing a relation between an ACPR and current consumption Icns with respect to RF output power (Pout) of a general RF power amplifier. The ACPR is a parameter generally used as an indicator representing distortion in a RF power amplifier. ACPR is an abbreviation of Adjacent Channel Leakage Power Ratio. In design of the RF power amplifier, in general, power added efficiency (PAE) and distortion due to the ACPR are in a tradeoff relation. As the power added efficiency (PAE) is improved, the distortion due to the ACPR increases. Improvement of efficiency is a basic problem in increasing battery operation time of the RF power amplifier. However, a reduction in the distortion due to the ACPR is also a basic problem in suppressing an interfering signal in mobile communication. In other words, a characteristic of the distortion due to the ACPR at desired output power of a RF power amplifier having high power added efficiency (PAE) is, in general, a monotonous increase characteristic from a bias point A2 to a bias point A1 in FIG. 3A with respect to an increase in the RF output power Pout. In general, the current consumption Icns of the RF power amplifier having high power added efficiency (PAE) monotonously increases as shown in FIG. 3B with respect to an increase in the RF output power Pout.

Figure 4A:
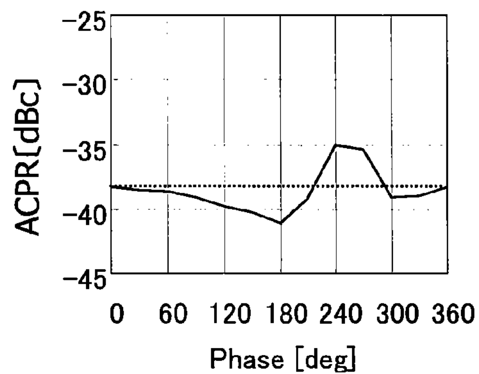
FIGS. 4A and 4B are graphs showing a result obtained by simulating a characteristic of the general RF power amplifier in which a directional coupler is used for detection of a transmitting output power level of the RF power amplifier.
Figure 4B:
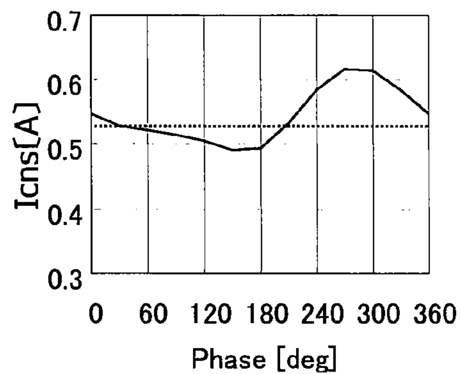

FIGS. 4A and 4B are graphs showing a result obtained by simulating a characteristic of the general RF power amplifier in which a directional coupler is used for detection of a transmitting output power level of the RF power amplifier. In FIGS. 4A and 4B, broken lines indicate a characteristic in the case in which a phase of a load of a RF power amplifier module is rotated by 0 to 360 degrees in a state in which the load is matched. As a condition of the simulation, a W-CDMA modulated input signal at an operated frequency of 915 MHz is supplied to the RF power amplifier module. In the state in which the load is matched in this way, even if the phase of the load is rotated by 0 to 360 degrees, the distortion due to the ACPR can be maintained constant as indicated by the broken line in FIG. 4A and the current consumption Icns can also be maintained constant as indicated by the broken line in FIG. 4B.

In FIGS. 4A and 4B, solid lines indicate a characteristic in the case in which the phase of the load is rotated by 0 to 360 degrees in a state in which a W-CDMA modulated signal is inputted to the RF power amplifier module and the load is mismatched at a VSWR (Voltage Standing-Wave Ratio) of 3:1. In the state in which the load is mismatched in this way, when the phase of the load is rotated by 0 to 360 degrees, the distortion due to the ACPR substantially fluctuates as indicated by the solid line in FIG. 4A and the current consumption Icns also substantially fluctuates as indicated by the solid line in FIG. 4B.

This fluctuation in the characteristic in the state of mismatching of the load is estimated as described below. When the directional coupler is used as described in Non-Patent Document 2, it is possible to detect a detected voltage of a vector sum of a combined voltage from a forward signal generated by the RF power amplifier and a combined voltage from a reverse signal reflected by the load. However, the detected voltage Vdet of the vector sum is given as represented by the following equation:

$$v_{det} = v_{AVSc} + v_{rc} = |v_{AVS}|\left(C + \frac{C}{D} \times |\Gamma| \times e^{-j\theta}\right) \quad \text{Equation 16}$$

Here, $V_{AVSc}$ is a combined voltage from a forward signal and Vrc is a combined voltage from a reverse signal, C is a voltage combined factor, D is directivity of the directional coupler, |Γ| is a load reflection coefficient, and θ is a phase difference between the forward signal and the reverse signal.

Therefore, when a directional coupler having extremely small C/D is used in Equation 16, the combined voltage Vrc from the reverse signal cannot be detected as the detected voltage Vdet with sufficient sensitivity. As a result, even if the phase of the load is rotated and the reverse signal from the load increases in the state in which the load is mismatched, the detected voltage Vdet due to the directional coupler does not increase much.

On the other hand, in the RF power amplifier module according to the embodiment of the present invention, the detected voltage Vdet is generated from the power level detectors 200*a* and 200*b*, to which the output voltages Va and Vb of the RF power amplifiers 60*a* and 60*b* of the balanced amplifier are supplied, and the adder 210. As described above (Equation 15), a value of the detected voltage Vdet is proportional to a sum of power of a forward signal and power of a reverse signal of RF signals at the outputs of the RF power amplifiers 60*a* and 60*b*. In other words, in the RF power amplifier module in FIG. 1, first, a forward signal of the RF signals at the outputs of the RF power amplifiers 60*a* and 60*b* becomes a part of the detected voltage Vdet. A reverse signal from the load as the antenna connected to the RF signal output terminal 12 is supplied to the inputs of the power level detector 200*a* and 200*b* from the output terminal 16 of the output matching network 80 through the RF signal input terminals 15*a* and 15*b*. Therefore, the reverse signal from the load as the antenna can also become another part of the detected voltage Vdet.

The transmitting power level signal Vramp supplied to the APC circuit 220 in a state in which the load as the antenna is matched is, for example, at a level corresponding to the RF output power Pout at the bias point A2 in FIGS. 3A and 3B. In this state, the closed loop of the variable gain amplifier 50, the RF power amplifier module 310, and the APC circuit 220 of the transmitter circuit in FIG. 1 controls a level of RF transmitting output power of the RF power amplifier according to the APC control voltage Vapc such that the detected voltage Vdet coincides with the transmitting power level signal Vramp corresponding to the bias point A2. At the bias point A2 in FIG. 3A or 3B, the RF output power Pout is not abnormally large and the distortion due to the ACPR and the current consumption Icns are not abnormally large values.

It is assumed that the load as the antenna comes into a state of mismatching and a reverse signal from the load as the antenna connected to the RF signal output terminal 12 of the RF power amplifier module in FIG. 1 extremely increases. Then, the reverse signal power Preverse is added to the forward signal power Pforward, the RF output power Pout of the RF power amplifier module changes from the bias point A2 to the bias point A1 in FIG. 3A or 3B, and the distortion due to the ACPR and the current consumption Icns are about to increase to abnormally large values. However, at this point, the extremely large reverse signal from the antenna connected to the RF signal output terminal 12 is supplied from the output terminal 16 of the output matching network 80 to the inputs of the power level detectors 200*a* and 200*b* through the RF signal input terminals 15*a* and 15*b*. Therefore, a value of the detected voltage Vdet increases in proportion to the reverse signal of the RF signal according to Equation 15 and reaches a level corresponding to the extremely large RF output power Pout at the bias point A1 in FIG. 3A or 3B. Compared with the transmitting power level signal Vramp corresponding to the bias point A2, the value of the detected voltage Vdet corresponding to the extremely large RF output power Pout at the bias points A1 is too large. As a result, the closed loop of the transmitter circuit in FIG. 1 reduces a gain of the RF power amplifier according to the APC control voltage Vapc such that the detected voltage Vdet returns to the transmitting power level signal Vramp corresponding to the bias point A2. Therefore, since the level of the RF transmitting output power transmitted from the RF power amplifier falls, the value of the detected voltage Vdet corresponding to the RF output power Pout returns to the proper level at the bias point A2 from the extremely high level at the bias point A1. As a result, the distortion due to the ACPR and the current consumption Icns can also return to proper values.

Figure 5A:
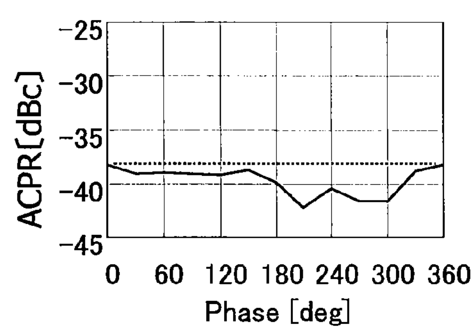
FIGS. 5A and 5B are diagrams showing a result of simulating a characteristic of a closed loop of a variable gain amplifier, a RF power amplifier module, and an APC circuit of the transmitter circuit in FIG. 1.
Figure 5B:
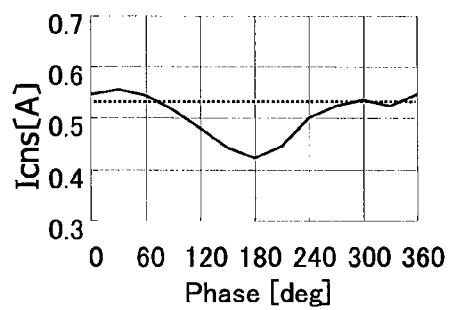

FIGS. 5A and 5B are diagrams showing a result obtained by simulating a characteristic of the closed loop of the variable gain amplifier 50, the RF power amplifier module 310, and the APC circuit 220 of the transmitter circuit in FIG. 1. In FIGS. 5A and 5B, broken lines indicate a characteristic in the case in which a phase of the load of the RF power amplifier module is rotated by 0 to 360 degrees in a state in which the load is matched. As a condition of the simulation, a W-CDMA modulated input signal at an operated frequency of 915 MHz is supplied to the RF power amplifier module. In the state in which the load is matched in this way, even if the phase of the load is rotated by 0 to 360 degrees, the distortion due to the ACPR can maintained constant as indicated by the broken line in FIG. 5A and the current consumption Icns can also be maintained constant as indicated by the broken line in FIG. 5B.

In FIGS. 5A and 5B, solid lines indicate a characteristic in the case in which the phase of the load is rotated by 0 to 360 degrees in a state in which a W-CDMA modulated signal is inputted to the RF power amplifier module and the load is mismatched at a VSWR (Voltage Standing-Wave Ratio) of 3:1. In the state in which the load is mismatched in this way, when the phase of the load is rotated by 0 to 360 degrees, the distortion due to the ACPR slightly fluctuates as indicated by the solid line in FIG. 5A and the current consumption Icns also slightly fluctuates as indicated by the solid line in FIG. 5B. However, the fluctuation in the distortion due to the ACPR and the current consumption Icns shown in FIGS. 5A and 5B is considerably reduced compared with the fluctuation in the distortion due to the ACPR and the current consumption Icns shown in FIGS. 4A and 4B. It is understood that it is by far more advantageous to use the power level detectors 200a and 200b and the adder 210 shown in FIG. 1 than to use a directional coupler for detection of transmitting power of the RF power amplifier.

In the state in which the load is mismatched in this way, depending on characteristics of a directional coupler, a power combiner of an output matching network, and the like, there is a phase of the load in which power consumption increases and the distortion due to the ACPR and the current consumption Icns increase as shown in FIGS. 3A and 3B. Therefore, in order to satisfy a distortion characteristic in the state of mismatching, back-off as a margin from a bias point at a maximum RF output power Pout (max) in a linear mode to a bias point at the start of a saturated mode may be increased. However, when the back-off as the margin is increased, there is a problem in that the maximum RF output power Pout (max) in the state in which the load is matched decreases and the power added efficiency (PAE) is deteriorated.

On the other hand, when the RF output power Pout changes from the bias point A2 to the bias point A1 in FIG. 3A or 3B because of mismatching of the load, the RF power amplifier module in FIG. 1 has an action of automatically returning the RF output power Pout from the bias point A1 to the bias point A2. Therefore, in the state in which the load is mismatched, in the RF power amplifier module in FIG. 1, the RF output power Pout can be reduced with power proportional to reverse power as an offset. In FIGS. 3A and 3B, when the voltage standing-wave ratio (VSWR) is 3:1, offset power (P1-P2) is ideally 1.25 dB. The distortion due to the ACPR and the current consumption corresponding to this offset power (P1-P2) of 1.25 dB can be reduced.

In the RF power amplifier module shown in FIG. 1, the RF power amplifiers 60a and 60b, the coupling condensers 100a and 100b, and the power level detectors 200a and 200b are formed on the identical semiconductor chip 310. Therefore, a distance from the output terminal of the RF power amplifier 60a to the input terminal of the power level detector 200a and a distance from the output terminal of the RF power amplifier 60b to the input terminal of the power level detector 200b are short. Therefore, the RF power amplifier module is less easily affected by noise due to electromagnetic coupling from other RF circuit sections, it is possible to improve accuracy of a detected voltage and facilitate circuit design, and substantially reduce a circuit area.

Other Embodiments

<<Multi-stage RF Power Amplifier>>

Figure 6:
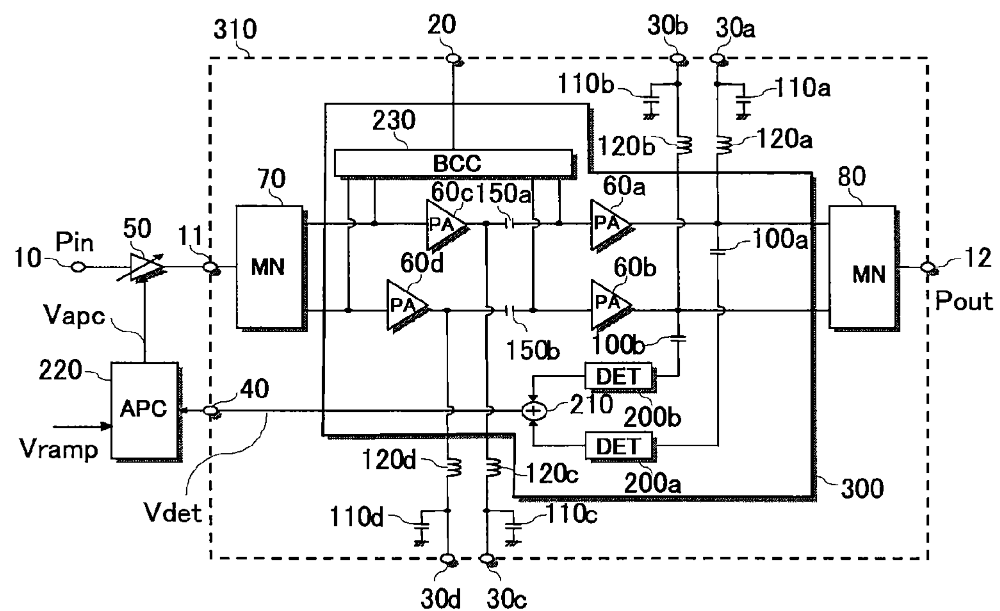
FIG. 6 is a block diagram showing a part of a transmitter circuit of a cellular phone terminal including a RF power amplifier module according to another embodiment of the present invention.

FIG. 6 is a block diagram showing an example of a transmitter circuit of a cellular phone terminal including the RF power amplifier module 310 according to another embodiment of the present invention. The embodiment of the present invention shown in FIG. 6 is basically different from the embodiment of the present invention shown in FIG. 1 in that the RF power amplifiers 60a and 60b in FIG. 1 are replaced with RF power amplifiers 60c, 60a, 60d, and 60b at multiple stages in FIG. 6. In other embodiments, each of the RF power amplifiers 60a and 60b in FIG. 1 can be replaced with RF power amplifiers at three stages. A coupling condenser 150a is connected between an output of the drive-stage RF power amplifier 60c and an input of the power-stage RF power amplifier 60a. A coupling condenser 150b is connected between an output of the drive-stage RF power amplifier 60d and an input of the power-stage RF power amplifier 60b. Moreover, a bias voltage generated from the bias control circuit 230 is supplied to an input of the drive-stage RF power amplifier 60c and an input of the drive-stage RF power amplifier 60d. A choke inductor 120c is connected between the output of the drive-stage RF power amplifier 60c and a drive voltage supplying terminal 30c. A choke inductor 120d is connected between the output of the drive-stage RF power amplifier 60d and a drive voltage supplying terminal 30d. By-pass condensers 110c and 110d are connected to the drive voltage supplying terminals 30c and 30d, respectively. Otherwise, the structure and operations in the embodiment of the present invention shown in FIG. 6 are identical with the structure and operations in the embodiment of the present invention shown in FIG. 1. Therefore, on the semiconductor chip 300, the drive-stage RF power amplifiers 60c and 60d, the coupling condensers 150a and 150b, the power-stage RF power amplifiers 60a and 60b, the coupling condensers 100a and 100b, the output matching network 80, the power level detectors 200a and 200b, the adder 210, and the bias control circuit 230 are formed.

A signal path from an output terminal of the drive-stage RF power amplifier 60c to an input terminal of the power-stage RF power amplifier 60a and a signal path from an output terminal of the drive-stage RF power amplifier 60d to an input terminal of the power-stage RF power amplifier 60b have electrical lengths substantially equal to each other. However, a phase difference of two RF signals outputted from the RF input matching network 70 may have an error from original 90 degrees. In this case, the electrical lengths of the two signal paths can be corrected such that a phase difference of RF signals supplied to the inputs of the power-stage RF power amplifiers 60a and 60b is 90 degrees with respect to each other.

<<Equidistant Connection and Symmetrical Layout>>

Figure 7:
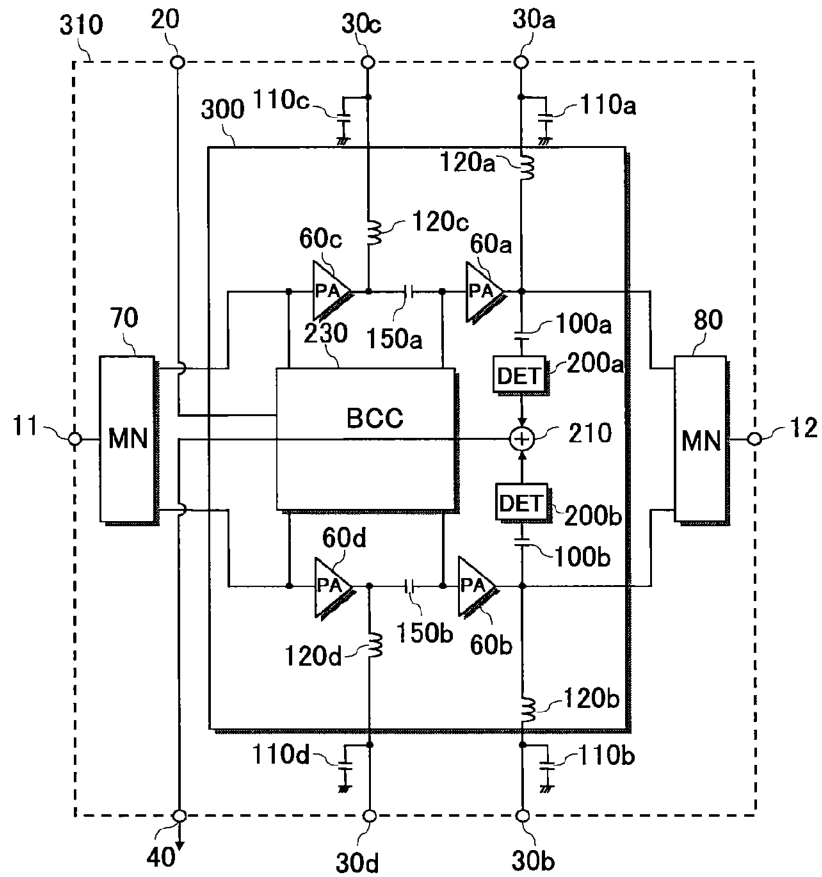
FIG. 7 is a diagram showing a plane layout of the RF power amplifier module and a semiconductor chip shown in FIG. 6.
Figure 8:
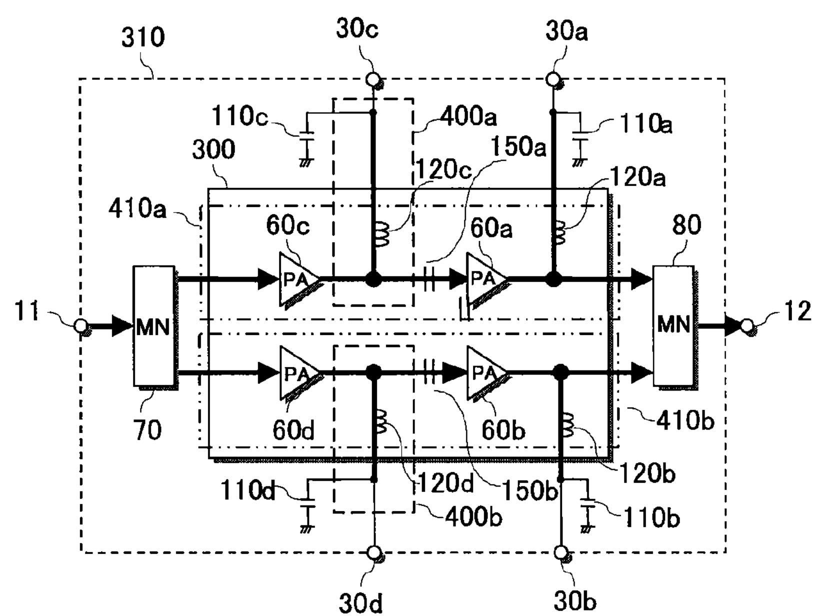
FIG. 8 is a diagram showing a portion related to a RF signal in the plane layout of the RF power amplifier module and the semiconductor chip shown in FIG. 7.

FIG. 7 is a diagram showing a plane layout of the RF power amplifier module 310 and the semiconductor chip 300 shown in FIG. 6. FIG. 8 is a diagram showing a section related to a RF signal in the plane layout of the RF power amplifier module 310 and the semiconductor chip 300 shown in FIG. 7.

In FIG. 7, the bias control circuit 230, the power level detectors 200a and 200b, and the adder 210 are arranged between the upper RF power amplifiers 60c and 60a and the lower RF power amplifiers 60d and 60b. The two outputs of the input matching network 70 are connected to the inputs of the drive-stage RF power amplifiers 60c and 60d, respectively, substantially in parallel and at substantially equal distances. The outputs of the drive-stage RF power amplifiers 60c and 60d are connected to the inputs of the power-stage RF power amplifiers 60a and 60b, respectively, via the coupling condensers 150a and 150b substantially in parallel and at substantially equal distances. The outputs of the power-stage RF power amplifiers 60a and 60b are connected to the two inputs of the output matching network 70, respectively, substantially in parallel and at substantially equal distances. Moreover, the outputs of the drive-stage RF power amplifiers 60c and 60d are connected to the by-pass condensers 110c and 110d and the drive voltage supplying terminals 30c and 30d, respectively, via the choke inductors 120c and 120d at a predetermined wiring distance. The outputs of the power-stage RF power amplifiers 60a and 60b are connected to the by-pass condensers 110a and 110b and the drive voltage supplying terminals 30a and 30b, respectively, via the choke inductors 120a and 120b at a predetermined wiring distance. Moreover, the outputs of the power-stage RF power amplifiers 60a and 60b are connected to the inputs of the power level detectors 200*a* and 200*b*, respectively, via the coupling condensers 100*a* and 100*b* at substantially equal distances. The outputs of the power level detectors 200*a* and 200*b* are connected to the input of the adder 210 at substantially equal distances. The output of the adder 210 is connected to the detected output terminal 40.

In FIG. 8, a RF main signal path 410*a* includes the RF power amplifiers 60*c* and 60*a* and an inter-stage matching network 400*a*. A RF main signal path 410*b* includes the RF power amplifiers 60*d* and 60*b* and an inter-stage matching network 400*b*. The inter-stage matching network 400*a* is connected to the by-pass condenser 110*c* between the output terminal of the RF power amplifier 60*c* and the input terminal of the RF power amplifier 60*a* and related to an electrical length of a RF signal. Similarly, the inter-stage matching network 400*b* is connected to the by-pass condenser 110*d* between the output terminal of the RF power amplifier 60*d* and the input terminal of the RF power amplifier 60*b* and related to the electrical length of the RF signal. In this way, the inter-stage matching networks 400*a* and 400*b* are arranged on the semiconductor chip 300 and the RF power amplifier module 310.

Circuit sections mounted on the semiconductor chip 300 in the inter-stage matching networks 400*a* and 400*b* are arranged vertically symmetrical to each other with respect to the RF main signal paths 410*a* and 410*b* on the semiconductor chip 300. On the semiconductor chip 300, the inter-stage matching network 400*a* does not cross the RF main signal path 410*b*. Similarly, the inter-stage matching network 400*b* does not cross the RF main signal path 410*a*. As a result, electro-magnetic interference of RF signals flowing through the respective RF main signal paths is reduced and it is possible to reduce distortion and reduce power consumption.

With the structure described above, in the RF power amplifier module 310, the electrical lengths of the RF main signal paths 410*a* and 410*b* are made equal to each other. Therefore, it is possible to perform an operation in which phases of RF output signals outputted from the power-stage RF power amplifiers 60*a* and 60*b* are different from each other by 90 degrees.

<<Multi-band RF Power Amplifier Module>>

FIG. 9 is a block diagram showing a part of a transmitter circuit of a cellular phone terminal including the RF power amplifier module 310 that generates multi-band RF transmitting output power according to still another embodiment of the present invention. A low-band RF input signal Pin_LB having a RF frequency of about 1 GHz and a high-band RF input signal Pin_HB having a RF frequency of about 2 GHz are supplied to the RF power amplifier module 310 shown in FIG. 9.

The low-band RF input signal Pin_LB of about 1 GHz is, for example, a RF transmitting signal of GSM850 having a RF frequency of 824 MHz to 849 MHz or a RF transmitting signal of GSM900 having a RF frequency of 880 MHz to 915 MHz. Besides, a RF transmitting signal of W-CDMA band 5 having a RF frequency of 824 MHz to 849 MHz and a RF transmitting signal of W-CDMA band 6 having a RF frequency of 830 MHz to 840 MHz are also possible.

The high-band RF input signal Pin_HB of about 2 GHz is, for example, a RF transmitting signal of DCS1800 having a RF frequency of 1710 MHz to 1785 MHz or a RF transmitting signal of PCS1900 having a RF frequency of 1850 MHz to 1910 MHz. Besides, a RF transmitting signal of W-CDMA band 1 having a RF frequency of 1920 MHz to 1980 MHz and a RF transmitting signal of W-CDMA band 2 having a RF frequency of 1850 MHz to 1910 MHz are also possible. Moreover, a RF transmitting signal of W-CDMA band 3 having a RF frequency of 1710 MHz to 1785 MHz and a RF transmitting signal of W-CDMA band 4 having a RF frequency of 1710 MHz to 1755 MHz are also possible.

The low-band RF input signal Pin_LB of about 1 GHz is supplied to a 1 GHz band RF signal input terminal 11*a* of a 1 GHz band input matching network 70*a*. An output signal of the 1 GHz band input matching network 70*a* is amplified by 1 GHz band RF power amplifiers 60*c*, 60*d*, 60*a*, and 60*b*. Output signals of the 1 GHz band RF power amplifiers 60*a* and 60*b* are supplied to a 1 GHz band output matching network 80*a*. An output of the 1 GHz band output matching network 80*a* is a 1 GHz band RF signal output terminal 12*a*. As in FIG. 8, in FIG. 9, a 1 GHz band RF main signal path 410*a* includes the 1 GHz band RF power amplifiers 60*c* and 60*a* and a 1 GHz band inter-stage matching network 400*a*. The 1 GHz band RF main signal path 410*b* includes the 1 GHz band RF power amplifiers 60*d* and 60*b* and a 1 GHz band inter-stage matching network 400*b*. The 1 GHz band inter-stage matching network 400*a* is connected to the by-pass condenser 110*c* between an output terminal of the RF power amplifier 60*c* and an input terminal of the RF power amplifier 60*a* and related to an electrical length of a 1 GHz band RF signal. Similarly, the 1 GHz band inter-stage matching network 400*b* is connected to the by-pass condenser 110*d* between an output terminal of the RF power amplifier 60*d* and an input terminal of the RF power amplifier 60*b* and related to the electrical length of the 1 GHz band RF signal. The 1 GHz band inter-stage matching networks 400*a* and 400*b* are arranged on the semiconductor chip 300 and the RF power amplifier module 310. Therefore, an upper half of the RF power amplifier module 310 is a 1 GHz band RF circuit section 420*a*.

The high-band RF input signal Pin_HB of about 2 GHz is supplied to a 2 GHz band RF signal input terminal 11*b* of a 2 GHz band input matching network 70*b*. An output signal of the 2 GHz band input matching network 70*b* is amplified by 2 GHz band RF power amplifiers 60*g*, 60*h*, 60*e*, and 60*f*. Output signals of the 2 GHz band RF power amplifiers 60*e* and 60*f* are supplied to a 2 GHz band output matching network 80*b*. An output of the 2 GHz output matching network 80*b* is a 2 GHz RF signal output terminal 12*b*. As in FIG. 8, in FIG. 9, a 2 GHz band RF main signal path 410*c* includes the 2 GHz band RF power amplifiers 60*g* and 60*e* and a 2 GHz inter-stage matching network 400*c*. A 2 GHz band RF main signal path 410*d* includes the 2 GHz band RF power amplifiers 60*h* and 60*f* and a 2 GHz band inter-stage matching network 400*d*. The 2 GHz band inter-stage matching network 400*c* is connected to a by-pass condenser 110*g* between an output terminal of the RF power amplifier 60*g* and an input terminal of the RF power amplifier 60*e* and related to an electrical length of a 2 GHz band RF signal. The 2 GHz band inter-stage matching network 400*d* is connected to a by-pass condenser 110*h* between an output terminal of the RF power amplifier 60*h* and an input terminal of the RF power amplifier 60*f* and related to the electrical length of the 2 GHz band RF signal. The 2 GHz band inter-stage matching networks 400*c* and 400*d* are arranged on the semiconductor chip 300 and the RF power amplifier module 310. Therefore, a lower half of the RF power amplifier module 310 is a 2 GHz band RF circuit section 420*b*.

With the structure described above, in the RF power amplifier module 310 shown in FIG. 9, electrical lengths of the 1 GHz band RF main signal paths 410*a* and 410*b* are equal to each other. Therefore, an operation in which phases of RF signals outputted from the 1 GHz band RF power amplifiers 60*a* and 60*b* are different from each other by 90 degrees is possible. Electrical lengths of the 2 GHz band RF main signal paths 410*c* and 410*d* are equal to each other. Therefore, an operation in which phases of RF signals outputted by the 2 GHz band RF power amplifiers 60*c* and 60*d* are different from each other by 90 degrees is possible.

<<Opposite-phase Input RF Power Amplifier>>

Figure 10:
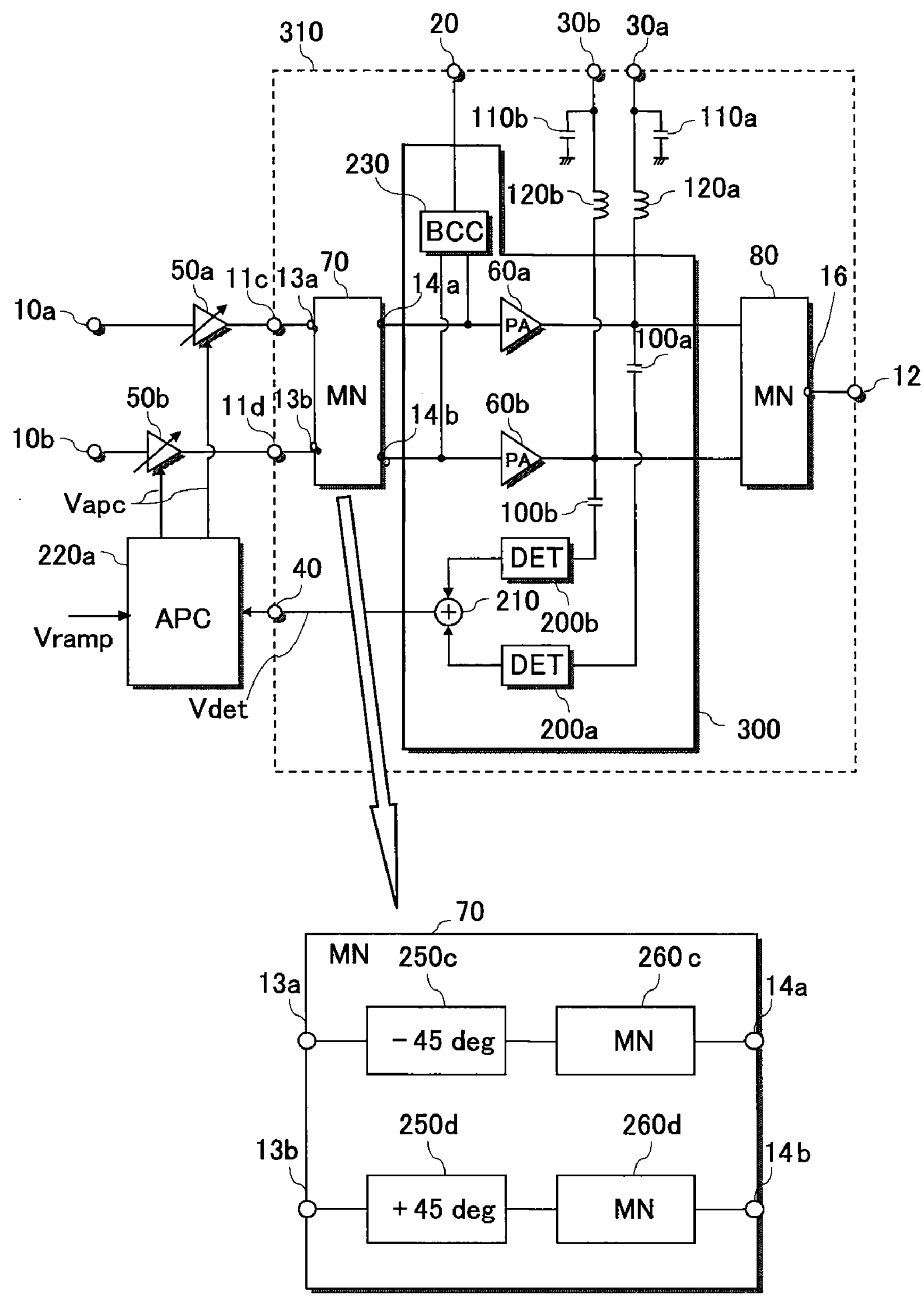
FIG. 10 is a block diagram showing a part of a transmitter circuit of a cellular phone terminal including a RF power amplifier module according to still another embodiment of the present invention.

FIG. 10 is a block diagram showing a part of a transmitting circuit of a cellular phone terminal including the RF power amplifier module 310 according to still another embodiment of the present invention. The embodiment of the present invention shown in FIG. 10 is basically different from the embodiment of the present invention shown in FIG. 1 in that, whereas a single input signal is supplied to the single RF signal input terminal 10 in FIG. 1, two input signals of phases opposite to each other (with a 180 degree phase difference) are supplied to RF signal input terminals 10*a* and 10*b*. The two input signals of phases opposite to each other (with a 180 degree phase difference) can be obtained from, for example, outputs of a not-shown differential amplifying circuit. Therefore, the RF signal input terminal 10 in FIG. 1 is replaced with the RF signal input terminals 10*a* and 10*b* in FIG. 10. The variable gain amplifier 50 in FIG. 1 is replaced with variable gain amplifiers 50*a* and 50*b* in FIG. 10. For example, one input signal of one RF signal input terminal 10*a* has a phase of 0 degree and the other input signal of the other RF signal input terminal 10*b* has a phase of −180 degrees. Amplified gains of the variable gain amplifiers 50*a* and 50*b* are commonly controlled according to the APC control voltage Vapc of the output of the APC circuit 220.

As shown in a lower part of FIG. 10, the input matching network 70 in FIG. 10 does not include the power divider 240 present in the input matching network 70 in FIG. 1. In FIG. 10, the RF signal input terminal 10*a* is connected to an input terminal of the variable gain amplifier 50*a*. An output terminal of the variable gain amplifier 50*a* is connected to the input matching network 70 via a RF signal input terminal 11*c*. The RF signal input terminal 10*b* is connected to an input terminal of the variable gain amplifier 50*b*. An output terminal of the variable gain amplifier 50*b* is connected to the input matching network 70 via the RF signal input terminal 11*d*. The input matching network 70 is a circuit having four terminals for two inputs and two outputs. One input terminal 13*a* is connected to the RF signal input terminal 11*c* and the other input terminal 13*b* is connected to the RF signal input terminal 11*d*. One output terminal 14*a* is connected to an input of the RF power amplifier 60*a* and the other output terminal 14*b* is connected to an input of the RF power amplifier 60*b*. The RF signal input terminal 13*a* of the input matching network 70 is connected to an input of a −45 degree phase shifter 250*c* and the RF signal input terminal 13*b* of the input matching network 70 is connected to an input of the +45 degree phase shifter 250*d*. An output of the −45 degree phase shifter 250*c* and an output of the +45 degree phase shifter 250*d* are connected to an input of a matching network 260*c* and an input of a matching network 260*d*, respectively. An output of the matching network 260*c* and an output of the matching network 260*d* are outputs 14*a* and 14*b* of the input matching network 70, respectively. The outputs 14*a* and 14*b* of the input matching network 70 are connected to the inputs of the RF power amplifiers 60*a* and 60*b*, respectively.

Therefore, a phase of one output signal of one output 14*a* of the input matching network 70 is −45 degrees (0 degree −45 degrees). A phase of one output signal of the other output 14*b* of the input matching network 70 is −135 degrees (−180 degrees +45 degrees). As a result, a phase difference between the two output signals of the two outputs 14*a* and 14*b* of the input matching network 70 shown in FIG. 10 is 90 degrees, which is completely equivalent to the phase difference between the two output signals of the two outputs 14*a* and 14*b* of the input matching network 70 shown in FIG. 1.

<<Variable Voltage Source>>

FIG. 11 is a block diagram showing a part of a transmitter circuit of a cellular phone terminal including the RF power amplifier module 310 according to still another embodiment of the present invention. The embodiment of the present invention shown in FIG. 11 is basically different from the embodiment of the present invention shown in FIG. 1 as described below. In FIG. 1, the drive voltage supplying terminals 30*a* and 30*b* of the module 310 and the bias control input terminal 20 of the bias control circuit 230 are connected to a drive voltage of cellular phone terminal. However, in FIG. 11, the bias control input terminal 20 of the bias control circuit 230 is connected to a variable drive voltage supplying circuit 430*a*. The drive voltage supplying terminals 30*a* and 30*b* of the module 310 are connected to a variable drive voltage supplying circuit 430*b*. Moreover, levels of variable drive voltages generated from the variable drive voltage supplying circuits 430*a* and 430*b* in FIG. 11 are controlled according to a level of the APC control voltage Vapc generated from the APC circuit 220. The variable drive voltage supplying circuits 430*a* and 430*b* in FIG. 11 can be constituted by low-power consumption DC/DC converter realized by a switching regulator or the like, a series regulator excellent in high-speed responsiveness, and the like. The variable drive voltage supplying circuits 430*a* and 430*b* in FIG. 11 supply drive voltages supplied to the RF power amplifiers 60*a* and 60*b* on the basis of an operating voltage from a battery mounted on the cellular phone terminal. In the RF power amplifier module 310 in FIG. 11, as in the RF power amplifier module 310 in FIG. 1, even when a reverse signal from the load extremely increases because of mismatching of the load, it is possible to suppress an increase in current consumption. As a result, it is possible to reduce consumption of the battery mounted on the cellular phone terminal and perform mobile communication for a long time.

Moreover, when RF transmitting output power generated from the RF power amplifiers 60*a* and 60*b* is at an extremely low level, power added efficiency is remarkably improved by controlling drive voltage levels supplied to drains or collectors of the RF power amplifiers 60*a* and 60*b* from the variable drive voltage supplying circuit 430*b* to be low. Therefore, when the RF transmitting output power is at an extremely low level, a drive voltage from the variable drive voltage supplying circuit 430*b* is controlled to a low level according to a low-level APC control voltage Vapc from the APC circuit 220. When the RF transmitting output power changes to a high level, a drive voltage from the variable drive voltage supplying circuit 430*b* can be controlled to a high level according to a high-level APC control voltage Vapc from the APC circuit 220.

When the RF transmitting output power is at an extremely low level, power added efficiency is remarkably improved by controlling bias voltage levels supplied to gates or bases of the RF power amplifiers 60*a* and 60*b* from the variable drive voltage supplying circuit 430*a* and the bias control circuit 230 to be low. Therefore, when the RF transmitting output power is at an extremely low level, bias voltages from the variable drive voltage supplying circuit 430*a* and the bias control circuit 230 are controlled to a low level according to a low-level APC control voltage Vapc from the APC circuit 220. When the RF transmitting output power changes to a high level, bias voltages from the variable drive voltage supplying circuit 430*a* and the bias control circuit 230 can be controlled to a high level according to a high-level APC control voltage Vapc from the APC circuit 220.

The invention devised by the inventor has been specifically explained on the basis of the embodiments. However, it goes without saying that the present invention is not limited to the embodiments and various modifications of the present invention are possible without departing from the spirit of the present invention.

For example, in the input matching network 70 and the output matching network 80, the phase shifter forms a phase difference of 90 degrees with +45 degrees and −45 degrees as a pair. However, arbitrary combinations such as a combination of a pair of 90 degrees and 0 degree are possible.

The number of RF main signal paths between the output of the input matching network 70 and the input of the output matching network 80 can be four other than two. In this case, a phase shifter of a first RF main signal path can set +135 degrees and +0 degree as a pair, a phase shifter of a second RF main signal path can set +90 degrees and +45 degrees as a pair, a phase shifter of a third RF main signal path can set +45 degrees and +90 degrees as a pair, and a phase shifter of a fourth RF main signal path can set +135 degrees and +0 degree as a pair.

As a power device for the RF power amplifier, it is possible to adopt HBTs (Hetero-junction Bipolar Transistors) of GaAs, InGaAs, and SiGe other than adopting a power MOSFET of an LD (Lateral Diffused) structure formed by silicon.

The by-pass condensers 110*a* and 110*b* of the RF power amplifier module 310 can be constituted by chip condensers. The choke inductors 120*a* and 120*b* of the RF power amplifier module 310 can be constituted by a part of multi-layer wiring of multi-layer circuit board or a lead of external connection. The coupling condensers 100*a* and 100*b* of the silicon semiconductor chip 300 can be constituted by MIM (metal/insulator/metal) condensers on the semiconductor chip 300.

The present invention has been described mainly about the cellular phone terminal. However, the present invention is not limited to the cellular phone terminal and can be widely applied to vehicle mounted devices, home electronics, and other devices and apparatuses employing wireless communication.

A multi-band/multi-mode power control circuit of the present invention has the effect of realizing a reduction in size and a reduction in cost of an output power detecting circuit of a RF power amplifier module mounted on a mobile communication terminal such as a cellular phone. The effect is displayed not only in the cellular phone but also in vehicle mounted devices, home electronics, and other apparatuses employing wireless communication.

What is claimed is:

1. An RF power amplifying device constituted as a balanced amplifier comprising:

a first RF power amplifier;

a second RF power amplifier;

first phase shifters arranged on input sides of the first RF power amplifier and the second RF power amplifier;

second phase shifters arranged on output sides of the first RF power amplifier and the second RF power amplifier;

a power divider that responds to an RF signal input supplied to an RF signal input terminal and supplies first and second outputs thereof to respective inputs of the first phase shifters, a power combiner that combines an output of the first RF power amplifier and an output of the second RF power amplifier transmitted through the second phase shifters; and an adder, wherein the first and second RF power amplifiers respectively amplify the first and second outputs of the power divider transmitted through the first shifters, wherein the RF power amplifying device further includes:

a first power level detector, an input of which is supplied with the output of the first RF power amplifier; and a second power level detector, an input of which is supplied with the output of the second RF power amplifier, and wherein an output of the first power level detector and an output of the second power level detector are supplied to the adder, and wherein a level of RF transmitting power obtained at an output of the power combiner is controlled by a detected signal from an output of the adder.

2. An RF power amplifying device according to claim 1, further comprising a level control circuit that generates a level control signal for controlling the level of the RF transmitting power obtained at the output of the power combiner in response to a desired transmitting power level signal and the detected signal from the output of the adder, wherein when a level of the detected signal rises to be higher than the desired transmitting power level signal, the level of the RF transmitting power is lowered according to the level control signal generated from the level control circuit.

3. An RF power amplifying device according to claim 2, wherein the first power level detector generates an output signal proportional to a square of an output voltage of the first power level detector, and the second power level detector generates an output signal proportional to a square of an output voltage of the second power level detector.

4. An RF power amplifying device according to claim 2, further comprising:

a variable gain amplifier controlled according to the level control signal generated from the level control circuit, wherein the power divider supplies an output of the variable gain amplifier to the respective inputs of the first phase shifters, and wherein the variable gain amplifier amplifies the RF signal input supplied to the RF signal input terminal in response to a level of the level control signal, and an RF amplified output signal subjected to gain control from the output of the variable gain amplifier is supplied to the input of the first RF power amplifier and the input of the second RF power amplifier via the power divider and the first phase shifters.

5. An RF power amplifying device according to claim 2, wherein the first RF power amplifier, the second RF power amplifier, the first phase shifters, the second phase shifters, the power combiner, the first power level detector, the second power level detector, and the adder of the RF power amplifying device are formed in a package of an RF power amplifier module.

6. An RF power amplifying device according to claim 5, wherein the balanced amplifier, including the first phase shifters, the first RF power amplifier, the second RF power amplifier, and the second phase shifters, amplifies a frequency band of any one of GSM850, GSM900, W-CDMA band 5, and W-CDMA band 6, and the RF power amplifying module further includes another balanced amplifier having an input matching network, a third RF power amplifier and a fourth RF power amplifier connected to two outputs of the input matching network, and an output matching network, two inputs of which are connected to an output of the third RF power amplifier and an output of the fourth RF power amplifier, and which amplifies a frequency band of any one of DCS1800, PCS1900, W-CDMA band 1, W-CDMA band 2, W-CDMA band 3, and W-CDMA band 4.

7. An RF power amplifying device according to claim 2, wherein the first RF power amplifier is constituted by a first multi-stage amplifier and the second RF power amplifier is constituted by a second multi-stage amplifier, a first electrical length from an output of a drive-stage amplifier of the first multi-stage amplifier of the first RF power amplifier to an output of a power-stage amplifier of the first multi-stage amplifier of the first RF power amplifier is set to a predetermined length, and a second electrical length from an output of a drive-stage amplifier of the second multi-stage amplifier of the second RF power amplifier to an output of a power-stage amplifier of the second multi-stage amplifier of the second RF power amplifier is set substantially equal to the first electrical length.

8. An RF power amplifying device according to claim 2, wherein the first phase shifters supply two RF input signals having a phase difference of about 90 degrees to the input of the first RF power amplifier and the input of the second RF power amplifier, respectively, and the second phase shifters adjust a phase between the outputs of the first and second RF power amplifiers and inputs of the power combiner, whereby a phase of an output of the first RF power amplifier transmitted to the power combiner through one of the second phase shifters and a phase of an output of the second RF power amplifier transmitted to the power combiner through another one of the second phase shifters substantially coincide with each other.

9. A wireless communication terminal device having a balanced amplifier system, the balanced amplifier system comprising:

a first RF power amplifier;

a second RF power amplifier;

first phase shifters arranged on input sides of the first RF power amplifier and the second RF power amplifier;

second phase shifters arranged on output sides of the first RF power amplifier and the second RF power amplifier;

a power divider that responds to an RF signal input supplied to an RF signal input terminal and supplies first and second outputs thereof to respective inputs of the first phase shifters, and a power combiner that combines an output of the first RF power amplifier and an output of the second RF power amplifier transmitted through the second phase shifter, wherein the first and second RF power amplifiers respectively amplify the first and second outputs of the power divider transmitted through the first shifters, wherein the balanced amplifier system further including:

a first power level detector, to an input of which is supplied with the output of the first RF power amplifier;

a second power level detector, an input of which is supplied with the output of the second RF power amplifier; and an adder to which an output of the first power level detector and an output of the second power level detector are supplied, and a level control circuit that generates a level control signal for controlling a level of RF transmitting power obtained at an output of the power combiner in response to a desired transmitting signal power level and a detected signal from an output of the adder, wherein when a level of the detected signal rises to be higher than the desired transmitting signal power level, the level of the RF transmitting power is lowered according to the level control signal generated from the level control circuit, and the balanced amplifier further includes a voltage source circuit that supplies a drive voltage to at least the first RF power amplifier and the second RF power amplifier based on an operating voltage from a battery.

10. A wireless communication terminal device according to claim 9, wherein the first power level detector generates an output signal proportional to a square of an output voltage of the first power level detector, and the second-power level detector generates an output signal proportional to a square of an output voltage of the second power level detector.

11. A wireless communication terminal device according to claim 9, wherein the balanced amplifier further includes:

a variable gain amplifier controlled according to the level control signal generated from the level control circuit; and wherein the power divider supplies an output of the variable gain amplifier to the inputs of the first phase shifters, the variable gain amplifier amplifies an RF signal input supplied to an RF signal input terminal in response to a level of the level control signal, and an RF amplified output signal subjected to gain control from the output of the variable gain amplifier is supplied to the input of the first RF power amplifier and the input of the second RF power amplifier via the power divider and the first phase shifters.

12. A wireless communication terminal device according to claim 9, wherein the first RF power amplifier, the second RF power amplifier, the first phase shifters, the second phase shifters, the power combiner, the first power level detector, the second power level detector, and the adder of the balanced amplifier are formed in a package of an RF power amplifier module.

13. A wireless communication terminal device according to claim 12, wherein the balanced amplifier, including the first phase shifters, the first RF power amplifier, the second RF power amplifier, and the second phase shifters, amplifies a frequency band of any one of GSM850, GSM900, W-CDMA band 5, and W-CDMA band 6, and the RF power amplifying module further includes another balanced amplifier having an input matching network, a third RF power amplifier and a fourth RF power amplifier connected to two outputs of the input matching network, and an output matching network, two inputs of which are connected to an output of the third RF power amplifier and an output of the fourth RF power amplifier and which amplifies a frequency band of any one of DCS1800, PCS1900, W-CDMA band 1, W-CDMA band 2, W-CDMA band 3, and W-CDMA band 4.

14. A wireless communication terminal device according to claim 9, wherein the first RF power amplifier is constituted by a first multi-stage amplifier and the second RF power amplifier is constituted by a second multi-stage amplifier, a first electrical length from an output of a drive-stage amplifier of the first multi-stage amplifier of the first RF power amplifier to an output of a power-stage amplifier of the first multi-stage amplifier of the first RF power amplifier is set to a predetermined length, and a second electrical length from an output of a drive-stage amplifier of the second multi-stage amplifier of the second RF power amplifier to an output of a power-stage amplifier of the second multi-stage amplifier of the second RF power amplifier is set substantially equal to the first electrical length.

15. A wireless communication terminal device according to claim 9, wherein the first phase shifters supply two RF input signals having a phase difference of about 90 degrees to the input of the first RF power amplifier and the input of the second RF power amplifier, respectively, and the second phase shifters adjust a phase between the outputs of the first and second RF power amplifiers and inputs of the power combiner, whereby a phase of an output of the first RF power amplifier transmitted to the power combiner through one of the second phase shifters and a phase of an output of the second RF power amplifier transmitted to the power combiner through another one of the second phase shifters substantially coincide with each other.

* * * * *